United States Patent
Bessho et al.

(10) Patent No.: US 9,117,977 B2
(45) Date of Patent: Aug. 25, 2015

(54) LIGHT EMITTING DEVICE, DISPLAY APPARATUS, AND ILLUMINATING APPARATUS

(75) Inventors: Hisanori Bessho, Osaka (JP); Takeshi Ishida, Osaka (JP); Yoshimasa Fujita, Osaka (JP); Yuhki Kobayashi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 99 days.

(21) Appl. No.: 13/997,650

(22) PCT Filed: Dec. 20, 2011

(86) PCT No.: PCT/JP2011/079490
§ 371 (c)(1),
(2), (4) Date: Jul. 30, 2013

(87) PCT Pub. No.: WO2012/090786
PCT Pub. Date: Jul. 5, 2012

(65) Prior Publication Data
US 2013/0299816 A1 Nov. 14, 2013

(30) Foreign Application Priority Data
Dec. 27, 2010 (JP) ................................ 2010-289773

(51) Int. Cl.
| | | |
|---|---|---|
| H01L 33/50 | (2010.01) | |
| H01L 27/32 | (2006.01) | |
| H01L 51/52 | (2006.01) | |
| H01L 51/50 | (2006.01) | |
| H01L 25/075 | (2006.01) | |
| H01L 33/60 | (2010.01) | |

(52) U.S. Cl.
CPC .............. *H01L 33/50* (2013.01); *H01L 27/322* (2013.01); *H01L 33/507* (2013.01); *H01L 51/5012* (2013.01); *H01L 51/5271* (2013.01); *H01L 25/0753* (2013.01); *H01L 27/3244* (2013.01); *H01L 33/60* (2013.01); *H01L 51/5275* (2013.01); *H01L 51/5284* (2013.01); *H01L 2924/0002* (2013.01)

(58) Field of Classification Search
CPC . H01L 51/5271; H01L 27/322; H01L 33/507; H01L 25/0753; H01L 51/5275; H01L 51/5284; H01L 27/3244; H01L 33/60; H01L 51/5262; H01L 51/5268; F21V 9/10; F21V 13/14; F21V 13/02; G02F 1/133617
USPC .................................................. 313/500–512
See application file for complete search history.

(56) References Cited

U.S. PATENT DOCUMENTS

| | | | |
|---|---|---|---|
| 5,126,214 A | 6/1992 | Tokailin et al. | |
| 6,469,755 B1 | 10/2002 | Adachi et al. | |
| 6,762,553 B1 | 7/2004 | Yokogawa et al. | |
| 6,985,275 B2 * | 1/2006 | Miyazawa | 359/245 |
| 7,368,307 B2 * | 5/2008 | Cok | 438/26 |
| 2008/0042146 A1 * | 2/2008 | Cok et al. | 257/79 |

FOREIGN PATENT DOCUMENTS

| | | | |
|---|---|---|---|
| JP | 2795932 B | | 9/1998 |
| JP | 11-329726 | * | 11/1999 |
| JP | 11-329726 A | | 11/1999 |
| JP | 2000-131683 A | | 5/2000 |
| JP | 2000-258771 | * | 9/2000 |
| JP | 2001-202827 A | | 7/2001 |
| JP | 2002-299044 | * | 10/2002 |
| JP | 2010-040976 A | | 2/2010 |

OTHER PUBLICATIONS

Kasegawa et al. (2009). "Advantages of Phosphor Sheet Structure in LED Backlight System," IDW '09, p. 1001-1004.
International Search Report mailed Feb. 7, 2012 for PCT/JP2011/079490, 1 page.

* cited by examiner

*Primary Examiner* — Jae Lee
*Assistant Examiner* — Mohammed R Alam
(74) *Attorney, Agent, or Firm* — Morrison & Foerster LLP

(57) ABSTRACT

A light emitting device includes an excitation light source element that emits excitation light; a substrate that faces the excitation light source element; a fluorescent layer located on the substrate, the fluorescent layer being excited by the excitation light to emit fluorescence; an optical reflection body disposed on a side surface of the fluorescent layer, the side surface extending in a direction parallel to a stacking direction of the substrate and the fluorescent layer; and a low-refractive-index material layer disposed between the fluorescent layer and the substrate, the low-refractive-index material layer having a refractive index lower than that of the substrate.

20 Claims, 10 Drawing Sheets

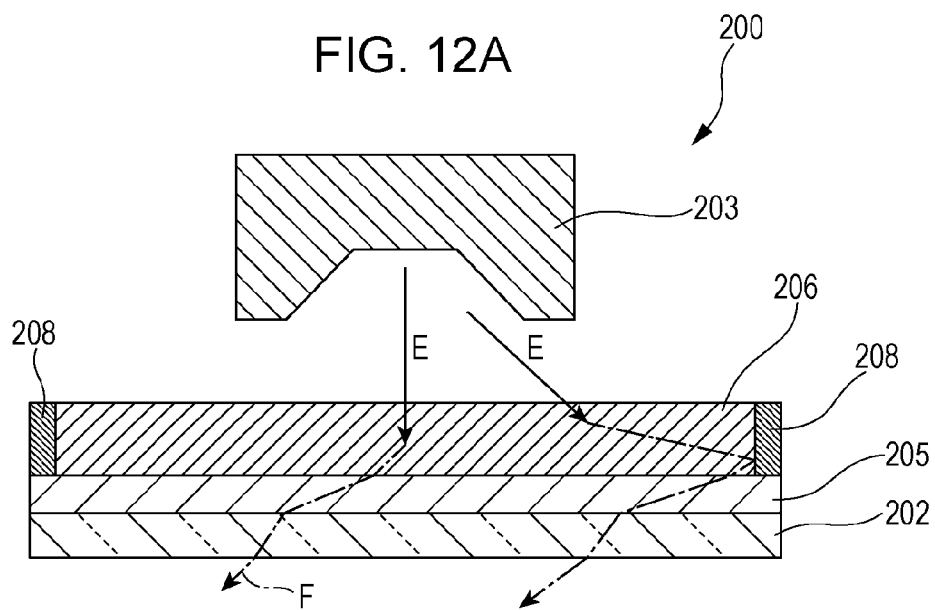
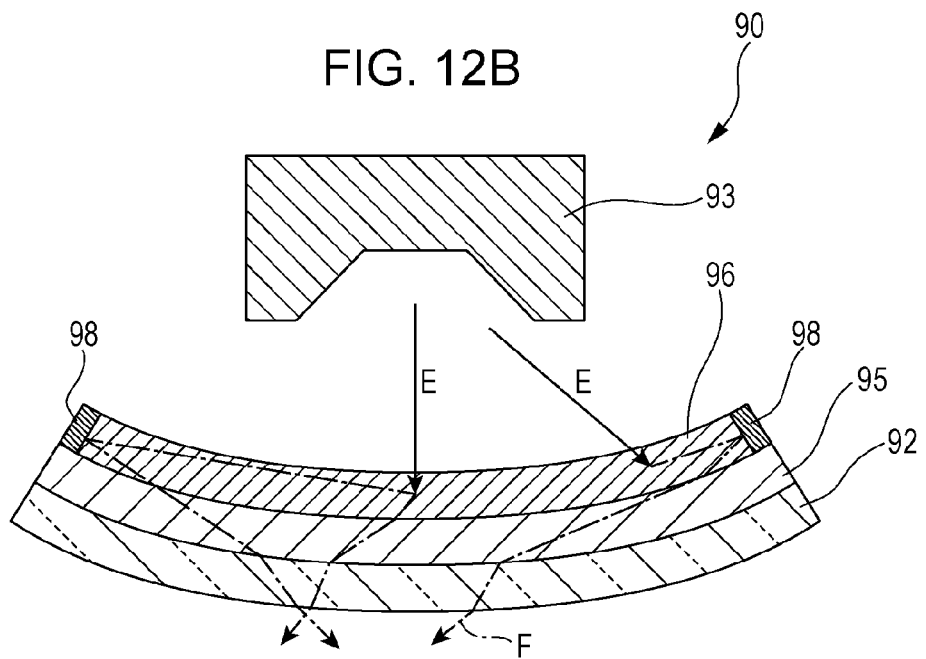

LIGHT EMITTING DEVICE, DISPLAY APPARATUS, AND ILLUMINATING APPARATUS

CROSS REFERENCE TO RELATED APPLICATIONS

This is a U.S. National Phase patent application of PCT/JP2011/079490, filed Dec. 20, 2011, which claims priority to Japanese patent application no. 2010-289773, filed Dec. 27, 2010, each of which is hereby incorporated by reference in the present disclosure in its entirety.

TECHNICAL FIELD

The present invention relates to a light emitting device including a fluorescent layer that emits fluorescence by using excitation light, a display apparatus, and an illuminating apparatus.

This application claims priority based on Japanese Patent Application No. 2010-289773 filed in Japan on Dec. 27, 2010, the contents of which are hereby incorporated by reference herein.

BACKGROUND ART

In recent years, needs of flat panel displays have been growing with realization of advanced information society. Examples of flat panel displays include liquid crystal displays (LCDs), which are non-self-emitting displays; and plasma displays (PDP), inorganic electroluminescence (inorganic EL) displays, and organic electroluminescence (hereinafter also referred to as "organic EL" or "organic LED") displays, which are self-emitting displays.

Among such flat panel displays, organic EL displays have particularly received attention because of their capability of self-light emission. In organic EL displays, there are known techniques such as a technique of displaying moving images by passive-matrix drive and a technique of displaying moving images by active-matrix drive that uses thin film transistors (hereinafter abbreviated as "TFTs"). In known organic EL displays, pixels that emit red light, green light, and blue light are placed side by side as one unit, and various colors such as white are produced to perform full-color display.

Such organic EL displays are generally realized by a method in which a red pixel, a green pixel, and a blue pixel are formed by selectively coating organic light-emitting layer materials by shadow mask deposition. However, this method poses problems concerning processing accuracy of a mask, alignment accuracy between a mask and a substrate, and an increase in the size of a mask.

In particular, in the field of large-size displays such as the field of televisions, the substrate size has been increasing from so-called G6 generation (1800 mm×1500 mm) to G8 generation (2460 mm×2160 mm) and G10 generation (3050 mm×2850 mm). In known production methods, a mask having a size equal to or larger than the substrate size is required and thus a mask corresponding to a large-size substrate needs to be produced and processed.

However, since such a mask is composed of a very thin metal film (typical thickness: 50 nm to 100 nm), it is difficult to produce and process a mask corresponding to a large-size substrate. When the processing accuracy of a mask and the alignment accuracy between a mask and a substrate are decreased, different light-emitting layer materials are mixed, which causes a color mixture of emitted light between pixels.

To prevent such a phenomenon, the width of an insulating layer disposed between the pixels needs to be increased. However, when the area of a pixel is fixed, the area of a light-emitting portion is decreased. That is, the aperture ratio of the pixels decreases, which decreases the luminance of organic EL elements, increases the power consumption, and shortens the life of organic EL elements.

In known production methods, a deposition source is disposed below a substrate and an organic layer is formed by depositing an organic material from a lower position toward an upper position. Therefore, when the sizes of a substrate and a mask are increased, flection is caused in the central portion of the mask. Such flection of the mask may cause the above-described color mixture of emitted light. In an extreme case, a portion in which an organic layer is not formed is formed and thus leakage is generated between upper and lower electrodes. Also in known production methods, such a mask is degraded and becomes unusable after certain numbers of uses. Therefore, an increases in the size of the mask leads to an increase in the production cost of displays.

To solve these problems, there has been proposed an EL element including an organic EL material unit that emits light in a blue region to a blue-green region; an organic EL material unit that emits light in an ultraviolet region; a fluorescent material unit that emits red light by using, as excitation light, the light in a blue region to a blue-green region emitted from the organic EL material unit; a fluorescent material unit that emits green light by using, as excitation light, the light in a blue region to a blue-green region; and a fluorescent material unit that emits blue light by using, as excitation light, the light in an ultraviolet region (e.g., refer to PTL 1). This EL element can be easily produced compared with the organic EL element produced by the above-described shadow mask patterning method and thus is excellent in terms of cost.

There has been also proposed an organic EL element including an EL light emitting element unit and a fluorescent layer, in which, by disposing a reflective film on the side surfaces of the fluorescent layer, light that travels toward the side surfaces can be efficiently output from the front (e.g., refer to PTL 2).

There has been also proposed a color display apparatus including a light source that emits light having an emission peak wavelength of 400 nm to 500 nm, a liquid crystal display element, and a wavelength conversion unit constituted by a fluorescent body in a combined manner (e.g., refer to PTL 3, PTL 4, and NPL 1). According to the description in PTL 3, since light is emitted from R, G, B fluorescent layers disposed outside a liquid crystal layer, the light utilization efficiency is high and thus a bright color display apparatus can be realized.

CITATION LIST

Patent Literature

PTL 1: Japanese Patent No. 2795932

PTL 2: Japanese Unexamined Patent Application Publication No. 11-329726

PTL 3: Japanese Unexamined Patent Application Publication No. 2000-131683

PTL 4: Japanese Unexamined Patent Application Publication No. 2001-202827

Non Patent Literature

NPL 1: IDW '09, p. 1001 (2009)

SUMMARY OF INVENTION

Technical Problem

However, in the EL element disclosed in PTL 1, since the light emitted from the fluorescent layer spreads isotropically, part of the light is reflected at the interface between the substrate and the outside and is not output to the outside. The reflected light enters the adjacent fluorescent material unit and causes the blurriness and fuzziness of display, which poses a problem in that the display quality degrades.

Furthermore, since the light emitted from the fluorescent layer spreads isotropically, the loss of light is large when the light emitted from the fluorescent layer is output to the outside, which poses a problem in that the emission efficiency is low. Therefore, the input power needs to be increased to achieve a predetermined emission efficiency, which increases the power consumption.

Also in the organic EL element disclosed in PTL 2, the incident angle of light that enters the substrate is not controlled. Therefore, there is a light component that reflects at the interface between the substrate and the outside, and consequently the display quality cannot be sufficiently improved. In addition, the light emitted toward the light source cannot be efficiently output, which poses a problem in that the emission efficiency cannot be sufficiently improved.

Also in the color display apparatus disclosed in PTL 3, since the light emitted from the fluorescent layer spreads isotropically, part of the light is reflected at the interface between the substrate and the outside and is not output to the outside. The reflected light enters the adjacent fluorescent material unit and causes the blurriness and fuzziness of display, which poses a problem in that the display quality degrades. Furthermore, the loss of light is large when the light emitted from the fluorescent layer is output to the outside, which poses a problem in that the emission efficiency is low.

In a light emitting element structure disclosed in PTL 4, the measures against the blurriness and fuzziness of display are taken, but the measures of efficiently outputting, to the outside, the light from the fluorescent layer are not taken. This poses a problem in that the emission efficiency cannot be sufficiently improved.

In view of the foregoing, it is an object of an aspect of the present invention to provide a light emitting device, a display apparatus, and an illuminating apparatus that can efficiently emit, to the outside, fluorescence generated from a fluorescent layer and that can realize high-luminance light emission.

Solution to Problem

According to aspects of the present invention, the following light emitting device, display apparatus, and illuminating apparatus are provided to solve the above problems.

A light emitting device according to an aspect of the present invention includes an excitation light source element that emits excitation light; a substrate that faces the excitation light source element; a fluorescent layer located on the substrate, the fluorescent layer being excited by the excitation light to emit fluorescence; an optical reflection body disposed on a side surface of the fluorescent layer, the side surface extending in a direction parallel to a stacking direction of the substrate and the fluorescent layer; and a low-refractive-index material layer disposed between the fluorescent layer and the substrate, the low-refractive-index material layer having a refractive index lower than that of the substrate.

The light emitting device may further include a wavelength-selective layer that transmits at least excitation light in a peak wavelength region of a wavelength range of the excitation light and reflects at least fluorescence in a peak wavelength region of a wavelength range of the fluorescence emitted from the fluorescent layer. The fluorescent layer may have an incidence surface from which the excitation light enters, the incidence surface facing the excitation light source element, and the wavelength-selective layer may be disposed on the incidence surface.

Furthermore, the fluorescent layer may be separated into a plurality of regions, and the low-refractive-index material layer may be disposed between the second substrate and each of the separated regions of the fluorescent layer.

Furthermore, a light-absorbing layer may be disposed between adjacent regions among the separated regions of the fluorescent layer.

The light-absorbing layer may be disposed between the low-refractive-index material layer and the substrate.

A surface of the light-absorbing layer, the surface facing the fluorescent layer, may be covered with the low-refractive-index material layer.

The low-refractive-index material layer may have such a refractive index that a critical angle of incident light that enters the low-refractive-index material layer from the fluorescent layer is smaller than a critical angle of outgoing light output from the second substrate toward an outside.

The substrate may be curved so that at least edges of the substrate are located closer to the excitation light source element.

A display apparatus according to another aspect of the present invention includes the light emitting device.

The excitation light source element may emit excitation light in an ultraviolet wavelength range, and the fluorescent layer may include at least a red fluorescent layer constituting a red pixel that emits red light by using the excitation light, a green fluorescent layer constituting a green pixel that emits green light by using the excitation light, and a blue fluorescent layer constituting a blue pixel that emits blue light by using the excitation light.

The excitation light source element may emit blue excitation light, the fluorescent layer may include at least a red fluorescent layer constituting a red pixel that emits red light by using the excitation light and a green fluorescent layer constituting a green pixel that emits green light by using the excitation light, and the display apparatus may include a scattering layer constituting a blue pixel that scatters the excitation light.

The display apparatus may further include an active-matrix drive element that drives the excitation light source element.

The fluorescence may be output from the substrate toward an outside.

The excitation light source element may be constituted by a light emitting diode, an organic electroluminescence element, or an inorganic electroluminescence element.

The display apparatus may further include a liquid crystal element that is disposed between the excitation light source element and the substrate and can control a transmittance of the excitation light. The excitation light source element may serve as a planar light source.

An illuminating apparatus according to still another aspect of the present invention includes the above light emitting device.

Advantageous Effects of Invention

According to aspects of the present invention, a light emitting device having high emission efficiency (high luminance), a display apparatus, and an illuminating apparatus can be provided.

BRIEF DESCRIPTION OF DRAWINGS

FIG. 12A is a cross-sectional view showing a light emitting device according to a fourth embodiment.

FIG. 12B is a cross-sectional view showing a light emitting device according to a fourth embodiment.

DESCRIPTION OF EMBODIMENTS

Figure 1:
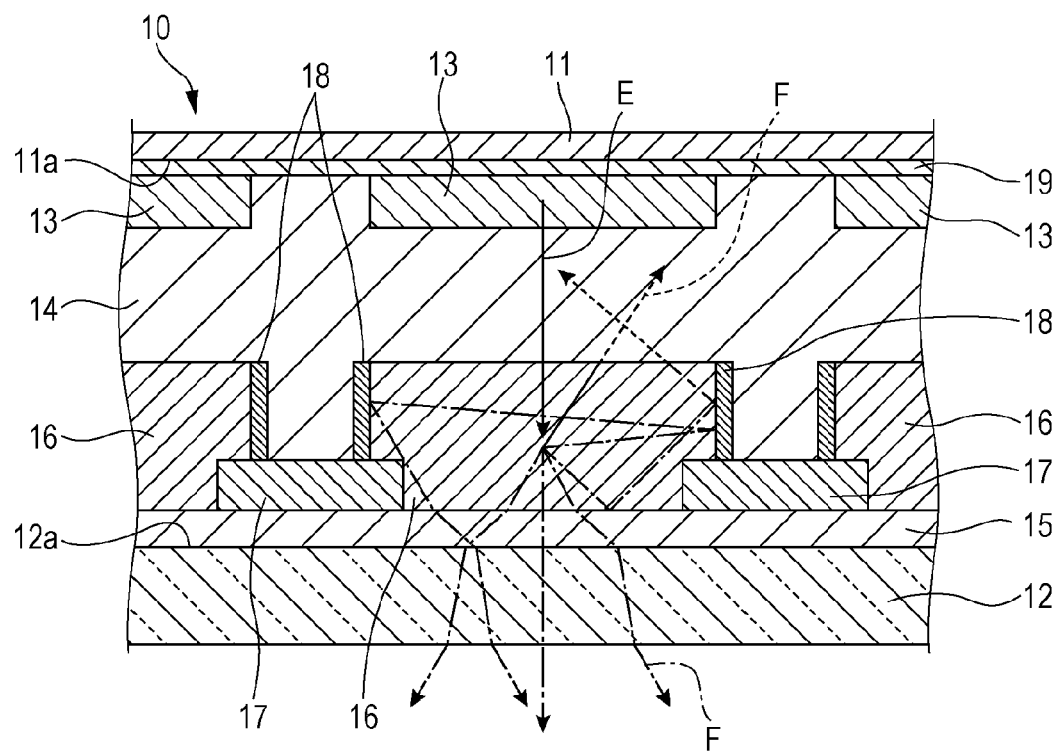
FIG. 1 is a cross-sectional view showing a light emitting device according to a first embodiment of the present invention.

Embodiments of a light emitting device, a display apparatus, and an electronic apparatus according to the present invention will now be described with reference to the attached drawings. The following embodiments are specifically described in order to provide better understanding of the sprit of the present invention and thus do not limit the present invention unless otherwise specified. In the drawings used in the description below, the principal part is sometimes enlarged to provide clear understanding of the features of the present invention, and thus the size ratio of constituent elements may be different from that of real constituent elements.

First Embodiment

FIG. 1 is a schematic cross-sectional view showing an example of a light emitting device according to a first embodiment of the present invention.

A light emitting device 10 includes a first substrate 11 and an excitation light source element 13 formed on one surface 11a of the substrate 11. An active drive element 19 is preferably further formed between the one surface 11a of the first substrate 11 and the excitation light source element 13. The active drive element 19 is an element for driving the excitation light source element 13 and may be, for example, a TFT.

A second substrate 12 is formed so as to face the first substrate 11 through a sealing layer 14. A low-refractive-index material layer 15 is formed on one surface 12a of the second substrate 12.

A fluorescent layer 16 is formed on the low-refractive-index material layer 15. The fluorescent layer 16 may be separately formed in a plurality of regions such as a plurality of pixel units. The fluorescent layer 16 is excited by excitation light E emitted from the excitation light source element 13 to emit fluorescence F. When the light emitting device 10 of this embodiment is used for display apparatuses such as full-color display apparatuses, the fluorescent layer 16 may be constituted by fluorescent layers of the three primary colors, such as a blue fluorescent layer, a green fluorescent layer, and a red fluorescent layer.

A light-absorbing layer 17 is further formed between the fluorescent layers 16 adjacent to each other. The light-absorbing layer 17 is formed so as to extend between the plurality of separately formed fluorescent layers 16 and the second substrate 12.

An optical reflection body 18 is formed on side surfaces of each of the fluorescent layers 16, the side surfaces extending in a stacking direction L of the first substrate 11 and second substrate 12.

The excitation light source element 13 may be constituted by, for example, a light emitting diode, an organic electroluminescence element (organic EL element), or an inorganic electroluminescence element (inorganic EL element). The excitation light source element 13 emits excitation light toward the fluorescent layer 16. The excitation light E emitted from the excitation light source element 13 excites the fluorescent layer 16. The excitation light source element 13 may emit light in an ultraviolet wavelength range or excitation light in a blue color wavelength range.

The low-refractive-index material layer 15 is composed of a material having a refractive index lower than that of the second substrate 12. In particular, the material preferably has such a refractive index that the critical angle of incident light (fluorescence) that enters the low-refractive-index material layer 15 from the fluorescent layer 16 is smaller than the critical angle of outgoing light (fluorescence) output from the second substrate toward the outside.

The effects of the light emitting device 10 having the above structure will be described.

As shown in FIG. 1, the excitation light E emitted from the excitation light source element 13 enters the fluorescent layer 16 to excite the fluorescent layer 16. Fluorescence F is output from the fluorescent layer 16. The fluorescence F output from the fluorescent layer 16 passes through the low-refractive-index material layer 15 and is output from the second substrate 12 toward the outside.

Herein, the low-refractive-index material layer 15 is composed of a material having a refractive index lower than that of the second substrate 12. Therefore, light that returns to the fluorescent layer 16 by reflection at the surface of the second substrate 12 when the fluorescence F emitted from the fluorescent layer 16 enters the second substrate 12, which brings a loss, can be reduced compared with a known structure not including the low-refractive-index material layer 15. This allows an increase in the light amount of output fluorescence F and a decrease in the power consumption.

Furthermore, compared with a known structure not including the low-refractive-index material layer 15, the incident angle at which the fluorescence F emitted from the fluorescent layer 16 can enter the second substrate 12 can be controlled by the low-refractive-index material layer 15. In other words, the incident angle at which the fluorescence F emitted from the fluorescent layer 16 can enter the second substrate 12 from the low-refractive-index material layer 15 can be controlled. This allows a reduction in the fluorescence F that undergoes total reflection at the interface between the second substrate 12 and the outside, which can reduce the blurriness and fuzziness of display.

The optical reflection body 18 is formed on the side surfaces of the fluorescent layer 16, the side surfaces extending in a stacking direction L of the first substrate 11 and second substrate 12. Thus, since part of the fluorescence F emitted toward the side surfaces of the fluorescent layer 16 is also reflected by the optical reflection body 18 toward the second substrate 12, the light amount of output fluorescence F can be further increased.

A structure of an organic EL element will now be described as an example of the excitation light source element 13.

Figure 2:
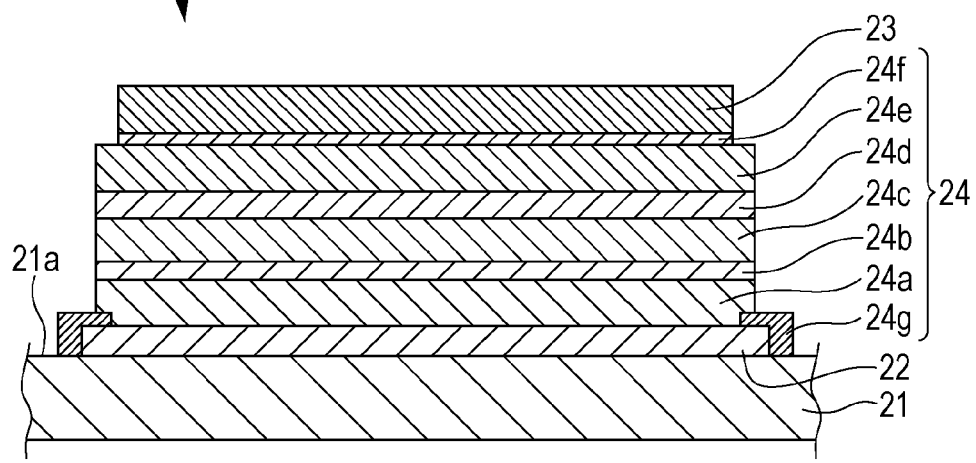
FIG. 2 is a cross-sectional view showing an organic EL element, which is an example of an excitation light source element.

FIG. 2 is a cross-sectional view showing an example of an organic EL element.

An organic EL element (excitation light source element) 20 includes a first electrode (anode) 22, a second electrode (cathode) 23, and an organic layer (organic EL layer) 24 disposed between the first electrode 22 and the second electrode 23, which are stacked on one surface 21a of a first substrate 21.

The organic layer (organic EL layer) 24 includes a hole injection layer 24a, a hole transport layer 24b, an organic light emitting layer 24c, a hole blocking layer 24d, an electron transport layer 24e, and an electron injection layer 24f, which are stacked in that order from the first electrode 22 side, and edge covers 24g formed on both sides of the first electrode 22.

When a certain voltage is applied between the first electrode 22 and the second electrode 23 of the organic EL element (excitation light source element) 20 having such a structure, excitation light such as ultraviolet light or blue light is generated from the organic light emitting layer 24c. By emitting the excitation light toward the fluorescent layer 16 (refer to FIG. 1), fluorescence can be output from the fluorescent layer 16.

A structure of an inorganic EL element will now be described as an example of the excitation light source element 13.

Figure 3:
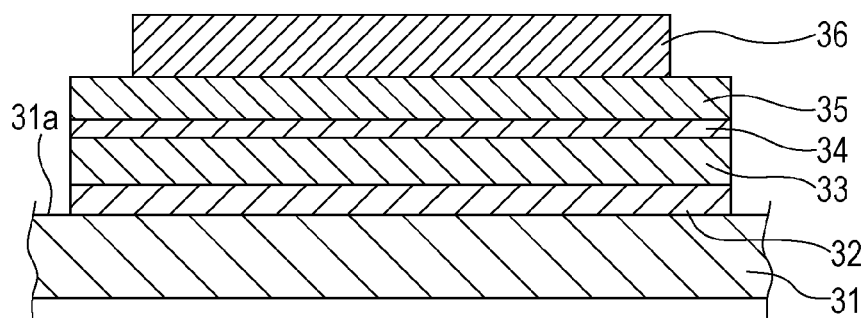
FIG. 3 is a cross-sectional view showing an inorganic EL element, which is an example of an excitation light source element.

FIG. 3 is a cross-sectional view showing an example of an inorganic EL element.

An inorganic EL element (excitation light source element) 30 includes a first electrode 32, a first dielectric layer (insulating layer) 33, an inorganic light emitting layer 34, a second dielectric layer (insulating layer) 35, and a second electrode 36, which are stacked on one surface 31a of a first substrate 31.

When a certain voltage is applied between the first electrode 32 and the second electrode 36 of the inorganic EL element (excitation light source element) 30 having such a structure, excitation light such as ultraviolet light or blue light is generated from the inorganic light emitting layer 34. By emitting the excitation light toward the fluorescent layer 16 (refer to FIG. 1), fluorescence can be output from the fluorescent layer 16.

A structure of a light emitting diode (LED) will now be described as an example of the excitation light source element 13.

Figure 4:
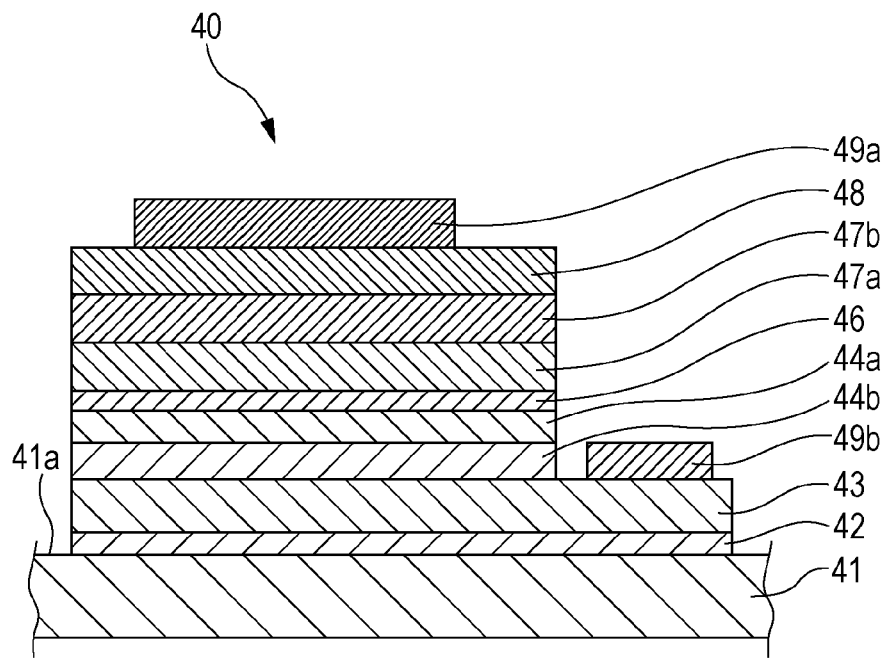
FIG. 4 is a cross-sectional view showing an LED, which is an example of an excitation light source element.

FIG. 4 is a cross-sectional view showing an example of an LED.

An LED (excitation light source element) 40 includes a buffer layer 42 and an n-type contact layer 43 stacked on one surface 41a of a first substrate 41. A second electrode (cathode) 49b is connected to the n-type contact layer 43. A second n-type cladding layer 44b, a first n-type cladding layer 44a, an active layer 46, a first p-type cladding layer 47a, a second p-type cladding layer 47b, a buffer layer 48, and a first electrode (anode) 49a are stacked on the n-type contact layer 43 in that order.

When a certain voltage is applied between the first electrode 44a and the second electrode 44b of the light emitting diode (LED) 40 having such a structure, recombination of electrons and holes are caused in the active layer 46 and thus excitation light such as ultraviolet light or blue light is generated. By emitting the excitation light toward the fluorescent layer 16 (refer to FIG. 1), fluorescence can be output from the fluorescent layer 16.

Second Embodiment

Figure 5:
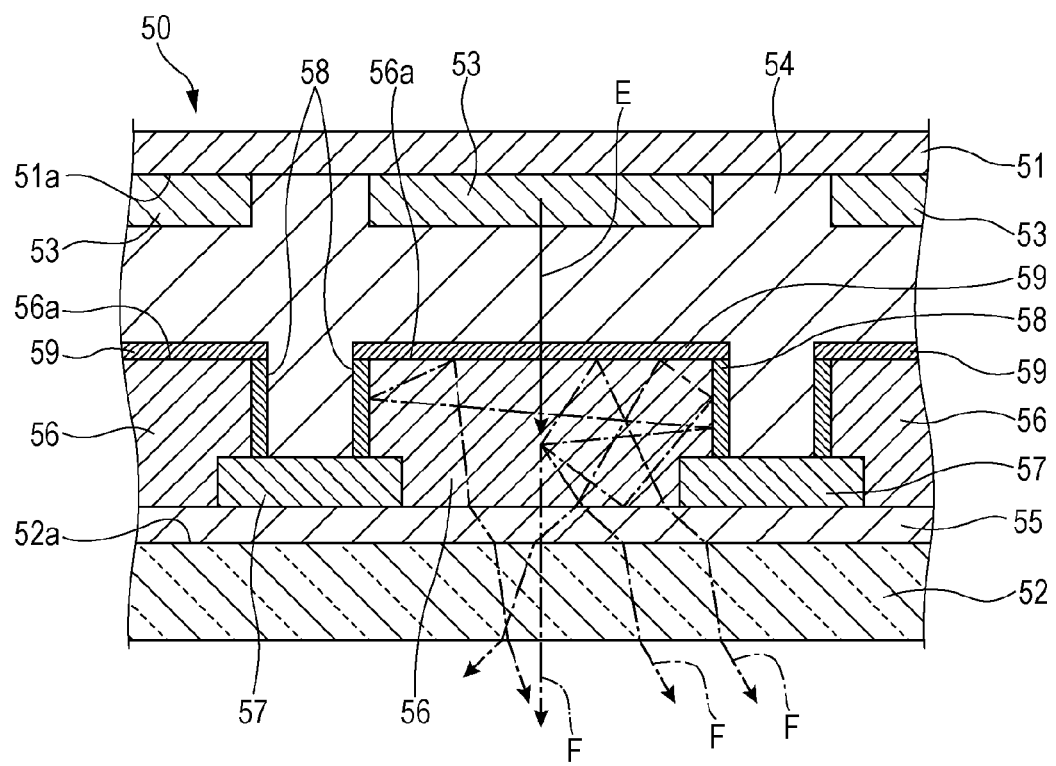
FIG. 5 is a cross-sectional view showing a light emitting device according to a second embodiment of the present invention.

FIG. 5 is a schematic cross-sectional view showing an example of a light emitting device according to a second embodiment of the present invention.

A light emitting device 50 includes a first substrate 51 and an excitation light source element 53 formed on one surface 51a of the substrate 51.

A second substrate 52 is formed so as to face the first substrate 51 through a sealing layer 54. A low-refractive-index material layer 55 is formed on one surface 52a of the second substrate 52.

A fluorescent layer 56 is formed on the low-refractive-index material layer 55. The fluorescent layer 56 may be separately formed in a plurality of regions such as a plurality of pixel units. The fluorescent layer 56 is excited by excitation light E emitted from the excitation light source element 53 to emit fluorescence F. When the light emitting device 50 of this embodiment is used for display apparatuses such as full-color display apparatuses, the fluorescent layer 56 may be constituted by fluorescent layers of the three primary colors, such as a blue fluorescent layer, a green fluorescent layer, and a red fluorescent layer.

A light-absorbing layer 57 is further formed between the fluorescent layers 56 adjacent to each other. The light-absorbing layer 57 may be formed so as to extend between the plurality of separately formed fluorescent layers 56 and the second substrate 52.

An optical reflection body 58 is formed on the side surfaces of each of the fluorescent layers 56, the side surfaces extending in a stacking direction L of the first substrate 51 and second substrate 52. Furthermore, a wavelength-selective layer 59 is formed on an excitation-light-incidence surface 56a of the fluorescent layer 56 that faces the excitation light source element 53.

The wavelength-selective layer 59 is an optical functional layer that transmits at least excitation light E in a peak wavelength region of the wavelength range of the excitation light E emitted from the excitation light source element 53 and reflects at least fluorescence F in a peak wavelength region of the wavelength range of the fluorescence F emitted from the fluorescent layer 56 through excitation by the excitation light E.

The effects of the light emitting device 50 having the above structure will be described.

As shown in FIG. 5, the excitation light E emitted from the excitation light source element 53 enters the fluorescent layer 56 through the wavelength-selective layer 59 to excite the fluorescent layer 56. Since the wavelength-selective layer 59 transmits at least excitation light E in a peak wavelength region of the wavelength range of the excitation light E, the excitation light E can reach the fluorescent layer 56. Fluorescence F is then emitted from the fluorescent layer 56. The fluorescence F emitted from the fluorescent layer 56 passes through the low-refractive-index material layer 55 and is output from the second substrate 52 toward the outside.

Herein, the low-refractive-index material layer 55 is composed of a material having a refractive index lower than that of the second substrate 52. For example, the low-refractive-index material layer 55 is composed of a material having such a refractive index that the critical angle of incident light (fluorescence F) that enters the low-refractive-index material layer 55 from the fluorescent layer 56 is smaller than the critical angle of outgoing light (fluorescence F) output from the second substrate 52 toward the outside. Therefore, light that returns to the fluorescent layer 56 by reflection at the surface of the second substrate 52 when the fluorescence F emitted from the fluorescent layer 56 enters the second substrate 52, which brings a loss, can be reduced. This allows an increase in the light amount of output fluorescence F and a decrease in the power consumption.

In addition, by forming the optical reflection body 58 on the side surfaces of the fluorescent layer 56 in a stacking direction L of the first substrate 51 and second substrate 52, part of the fluorescence F emitted toward the side surfaces of the fluorescent layer 56 is also reflected by the optical reflection body 58 toward the second substrate 52. Therefore, the light amount of output fluorescence F can be further increased.

Moreover, fluorescence F that is emitted in a returning direction from the fluorescent layer 56 toward the excitation light source element 53 is also reflected toward the second substrate 52 without being returned to the excitation light source element 53, by the low-refractive-index material layer 55 that reflects at least fluorescence F in a peak wavelength region of the wavelength range of the fluorescence F emitted from the fluorescent layer 56. Therefore, the light amount of output fluorescence F can be further increased.

Third Embodiment

Figure 6:
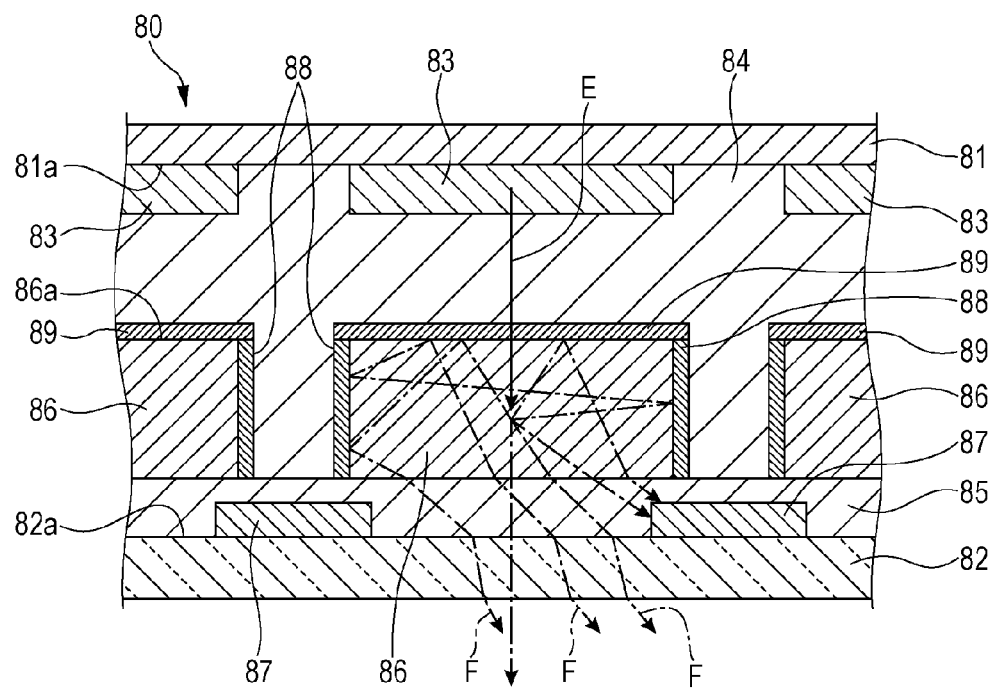
FIG. 6 is a cross-sectional view showing a light emitting device according to a third embodiment of the present invention.

FIG. 6 is a schematic cross-sectional view showing an example of a light emitting device according to a third embodiment of the present invention.

A light emitting device 80 includes a first substrate 81 and an excitation light source element 83 formed on one surface 81a of the substrate 81.

A second substrate 82 is formed so as to face the first substrate 81 through a sealing layer 84. A light-absorbing layer 87 is formed on one surface 82a of the second substrate 82. The light-absorbing layer 87 is formed so as to be located between fluorescent layers 86 disposed as upper layers. A low-refractive-index material layer 85 is formed so as to cover the light-absorbing layer 87.

In other words, the light-absorbing layer 87 is formed inside the low-refractive-index material layer 85 so that the surface of the light-absorbing layer 87 facing the fluorescent layer 86 serving as an upper layer is covered with the low-refractive-index material layer 85.

Furthermore, a fluorescent layer 86 is stacked on the low-refractive-index material layer 85 that covers the light-absorbing layer 87. The fluorescent layer 86 may be separately formed in a plurality of regions such as a plurality of pixel units. The fluorescent layer 86 is excited by excitation light E emitted from the excitation light source element 83 to emit fluorescence F. When the light emitting device 80 of this embodiment is used for display apparatuses such as full-color display apparatuses, the fluorescent layer 86 may be constituted by fluorescent layers of the three primary colors, such as a blue fluorescent layer, a green fluorescent layer, and a red fluorescent layer.

An optical reflection body 88 is formed on the side surfaces of each of the fluorescent layers 86, the side surfaces extending in a stacking direction L of the first substrate 81 and second substrate 82. Furthermore, a wavelength-selective layer 89 is formed on an excitation-light-incidence surface 83a of the fluorescent layer 86 that faces the excitation light source element 83.

The wavelength-selective layer 89 is an optical functional layer that transmits at least excitation light E in a peak wavelength region of the wavelength range of the excitation light E emitted from the excitation light source element 83 and reflects at least fluorescence F in a peak wavelength region of the wavelength range of the fluorescence F emitted from the fluorescent layer 66 through excitation by the excitation light E.

In the light emitting device 80 according to the third embodiment, the low-refractive-index material layer 85 is formed so as to cover the light-absorbing layers 87 that are formed in an intermittent manner. Therefore, the low-refractive-index material layer 85 serving as a base for forming the fluorescent layer 86 functions as a planarizing layer and thus the fluorescent layer 86 can be accurately formed in a desired shape.

Fourth Embodiment

FIG. 12A is a schematic cross-sectional view showing an example of a light emitting device according to a fourth embodiment of the present invention.

A light emitting device 200 includes a substrate 202, an excitation light source element 203, a low-refractive-index material layer 205, a fluorescent layer 206, and an optical reflection body 208. In this embodiment, the light emitting device 200 does not necessarily include a substrate disposed so as to face the substrate 202. In other words, the excitation light source element 203 is not necessarily formed on the substrate disposed so as to face the substrate 202. The excitation light source element 203 may be fixed to the substrate 202 with a resin layer (not shown). The low-refractive-index material layer 205 is formed on the substrate 202. The fluorescent layer 206 is formed on the low-refractive-index material layer 205.

The excitation light source element 203 may be a light emitting diode, an organic electroluminescence element (organic EL element), or an inorganic electroluminescence element (inorganic EL element). The excitation light source element 203 emits excitation light toward the fluorescent layer 206. The excitation light source element 203 may emit, for example, light in an ultraviolet wavelength range or excitation light in a blue color wavelength range. When the light emitting device of this embodiment is used as an illuminating apparatus, the number of the excitation light source element 203 may be one or more.

The low-refractive-index material layer 205 is composed of a material having a refractive index lower than that of the substrate 202. In particular, the material preferably has such a refractive index that the critical angle of incident light (fluorescence) that enters the low-refractive-index material layer 205 from the fluorescent layer 206 is smaller than the critical angle of outgoing light (fluorescence) output from a second substrate toward the outside.

The fluorescent layer 206 is excited by excitation light E emitted from the excitation light source element 203 to emit fluorescence F. When the light emitting device of this embodiment is used as an illuminating apparatus, the fluorescent layer 206 is not necessarily formed in a separated manner.

An optical reflection body 208 is formed on the side surfaces of the fluorescent layer 206. Therefore, since part of the fluorescence F emitted toward the side surfaces of the fluorescent layer 206 is also reflected by the optical reflection body 208 toward the substrate 202, the light amount of output fluorescence F can be further increased.

The effects of the light emitting device 200 having the above structure will be described.

As shown in FIG. 12A, the excitation light E emitted from the excitation light source element 203 enters the fluorescent layer 206 to excite the fluorescent layer 206. Fluorescence F is then emitted from the fluorescent layer 206. The fluorescence F emitted from the fluorescent layer 206 passes through the low-refractive-index material layer 205 and is output from the substrate 202 toward the outside.

Herein, the low-refractive-index material layer 205 is composed of a material having a refractive index lower than that of the substrate 202. Therefore, light that returns to the fluorescent layer 206 by reflection at the surface of the substrate 202 when the fluorescence F emitted from the fluorescent layer 206 enters the substrate 202, which brings a loss, can be reduced compared with a known structure not including the low-refractive-index material layer 205. This allows an increase in the light amount of output fluorescence F and a decrease in the power consumption.

Furthermore, compared with a known structure not including the low-refractive-index material layer 205, the incident angle at which the fluorescence F emitted from the fluorescent layer 206 can enter the substrate 202 can be controlled by the low-refractive-index material layer 205. In other words, the incident angle at which the fluorescence F emitted from the fluorescent layer 206 can enter the substrate 202 from the low-refractive-index material layer 205 can be controlled. This allows a reduction in the fluorescence F that undergoes total reflection at the interface between the substrate 202 and the outside, which can reduce the blurriness and fuzziness of display.

FIG. 12B shows a light emitting device 90, which is a modification of this embodiment. The light emitting device 90 includes a substrate 92, an excitation light source element 93, a low-refractive-index material layer 95, a fluorescent layer 96, and an optical reflection body 98. The substrate 92 is curved so that the edges of the substrate 92 are located closer to the excitation light source element 93. The substrate 92 may be curved only at the edges or the entire substrate 92 may be curved. The low-refractive-index material layer 95 and the fluorescent layer 96 are formed on the substrate 92. The low-refractive-index material layer 95 and the fluorescent layer 96 are also curved as with the substrate 92.

By curving the substrate 92, the low-refractive-index material layer 95, and the fluorescent layer 96, the fluorescent layer 96 can be efficiently irradiated with excitation light even when the emission angle of the excitation light emitted from the excitation light source element 93 is large.

Fifth Embodiment

The constituent components and production method of each of the light emitting devices according to the above embodiments will now be specifically described. However, the above embodiments are not limited to the constituent components and production method.

Since fluorescence emitted from a fluorescent body needs to be output to the outside, a substrate (second substrate) on which a fluorescent layer used in this embodiment is formed needs to transmit light in an emission wavelength range of the fluorescent body. The second substrate may be, for example, an inorganic material substrate composed of glass or quartz or a plastic substrate composed of polyethylene terephthalate, polycarbazole, or polyimide. However, this embodiment is not limited to these substrates.

A plastic substrate is preferably used to allow the formation of a curbed portion or a bent portion without applying a stress. Furthermore, a substrate obtained by coating a plastic substrate with an inorganic material is more preferably used from the viewpoint of improving the gas barrier properties. The use of such a substrate can prevent the degradation of organic EL elements due to the permeation of moisture which occurs when an organic EL element is used as an excitation light source element (it is known that organic EL elements are degraded with a small amount of moisture).

The fluorescent layer is constituted by a blue fluorescent layer, a green fluorescent layer, and a red fluorescent layer that absorb excitation light emitted from an ultraviolet-light-emitting organic EL element, a blue-light-emitting organic EL element, an ultraviolet-light-emitting LED, and a blue-light-emitting LED and that emit blue light, green light, and red light, respectively. When necessary, fluorescent bodies that emit cyan light and yellow light are preferably added to a pixel.

When the color purity of each pixel that emits cyan light or yellow light is located outside a triangle formed by connecting three points representing color purities of pixels that emit red light, green light, and blue light on a chromaticity diagram, the color reproduction region can be further broadened compared with display apparatuses that use pixels which emit light of the three primary colors, namely, red light, green light, and blue light.

The fluorescent layer may be composed of only a fluorescent material shown below. The fluorescent layer may be composed of a fluorescent material shown below and, if necessary, additives. The fluorescent layer may have a structure in which a fluorescent material shown below is dispersed in a polymer material (binder resin) or an inorganic material.

A publicly known fluorescent material can be used as the above fluorescent material. Such a fluorescent material is classified into an organic fluorescent material and an inorganic fluorescent material. Specific compounds of the organic fluorescent material and inorganic fluorescent material are shown below, but this embodiment is not limited to these materials.

The organic fluorescent material is shown below. Examples of fluorescent dyes that convert ultraviolet excitation light into blue light include stilbenzene dyes such as 1,4-bis(2-methylstyryl)benzene and trans-4,4'-diphenylstilbenzene; and coumarin dyes such as 7-hydroxy-4-methylcoumarin. Examples of fluorescent dyes that convert ultraviolet or blue excitation light into green light include coumarin dyes such as 2,3,5,6-1H,4H-tetrahydro-8-trifluoromethylquinolizino(9,9a,1-gh)coumarin (Coumarin 153), 3-(2'-benzothiazolyl)-7-diethylaminocoumarin (Coumarin 6), 3-(2'-benzimidazolyl)-7-N,N-diethylaminocoumarin (Coumarin 7); and naphthalimide dyes such as Basic Yellow 51, Solvent Yellow 11, and Solvent Yellow 116.

Examples of fluorescent dyes that convert ultraviolet or blue excitation light into red light include cyanine dyes such as 4-dicyanomethylene-2-methyl-6-(p-dimethylaminostyryl)-4H-pyran; pyridine dyes such as 1-ethyl-2-[4-(p-dimethylaminophenyl)-1,3-butadienyl]-pyridinium-perchlorate; and rhodamine dyes such as Rhodamine B, Rhodamine 6G, Rhodamine 3B, Rhodamine 101, Rhodamine 110, Basic Violet 11, and Sulforhodamine 101.

The inorganic fluorescent material is shown below. Examples of fluorescent bodies that convert ultraviolet excitation light into blue light include $Sr_2P_2O_7:Sn^{4+}$, $Sr_4Al_{14}O_{25}:Eu^{2+}$, $BaMgAl_{10}O_{17}:Eu^{2+}$, $SrGa_2S_4:Ce^{3+}$, $CaGa_2S_4:Ce^{3+}$, $(Ba,Sr)(Mg,Mn)Al_{10}O_{17}:Eu^{2+}$, $(Sr,Ca,Ba_2,0Mg)_{10}(PO_4)_6Cl_2:Eu^{2+}$, $BaAl_2SiO_8:Eu^{2+}$, $Sr_2P_2O_7:Eu^{2+}$, $Sr_5(PO_4)_3Cl:Eu^{2+}$, $(Sr,Ca,Ba)_5(PO_4)_3Cl:Eu^{2+}$, $BaMg_2Al_{16}O_{27}:Eu^{2+}$, $(Ba,Ca)_5(PO_4)_3Cl:Eu^{2+}$, $Ba_3MgSi_2O_8:Eu^{2+}$, and $Sr_3MgSi_2O_8:Eu^{2+}$.

Examples of fluorescent bodies that convert ultraviolet or blue excitation light into green light include $(BaMg)Al_{16}O_{27}:Eu^{2+}$, $Mn^{2+}$, $Sr_4Al_{14}O_{25}:Eu^{2+}$, $(SrBa)Al_{12}Si_2O_8:Eu^{2+}$, $(BaMg)_2SiO_4:Eu^{2+}$, $Y_2SiO_5:Ce^{3+}$, $Tb^{3+}$, $Sr_2P_2O_7-Sr_2B_2O_5:Eu^{2+}$, $(BaCaMg)_5(PO_4)_3Cl:Eu^{2+}$, $Sr_2Si_3O_8{-2}SrCl_2:Eu^{2+}$, $Zr_2SiO_4 \cdot MgAl_{11}O_{19}:Ce^{3+}$, $Tb^{3+}$, $Ba_2SiO_4:Eu^{2+}$, $Sr_2SiO_4:Eu^{2+}$, and $(BaSr)SiO_4:Eu^{2+}$.

Examples of fluorescent bodies that convert ultraviolet or blue excitation light into red light include $Y_2O_2S:Eu^{3+}$, $YAlO_3:Eu^{3+}$, $Ca_2Y_2(SiO_4)_6:Eu^{3+}$, $LiY_9(SiO_4)_6O_2:Eu^{3+}$, $YVO_4:Eu^{3+}$, $CaS:Eu^{3+}$, $Gd_2O_3:Eu^{3+}$, $Gd_2O_2S:Eu^{3+}$, $Y(P,V)O_4:Eu^{3+}$, $Mg_4GeO_{5.5}F:Mn^{4+}$, $Mg_4GeO_6:Mn^{4+}$, $K_5Eu_{2.5}(WO_4)_{6.25}$, $Na_5Eu_{2.5}(WO_4)_{6.25}$, $K_5Eu_{2.5}(MoO_4)_{6.25}$, and $Na_5Eu_{2.5}(MoO_4)_{6.25}$.

The inorganic fluorescent bodies may be optionally subjected to surface modification. The surface modification is performed by, for example, a chemical treatment that uses a silane coupling agent, a physical treatment in which submicron fine particles or the like are added, or the combination of the chemical treatment and the physical treatment.

The inorganic material is preferably used in consideration of the degradation due to excitation light and emitted light, that is, the stability of the fluorescent layer.

When the inorganic material is used, the average particle diameter ($d_{50}$) is preferably 0.5 μm to 50 μm. If the average particle diameter is 1 μm or less, the luminous efficiency of the fluorescent body decreases. If the average particle diameter is 50 μm or more, it is difficult to form a flat film. In the case where the excitation light source element is an organic EL element, depletion occurs between the fluorescent layer and the organic EL element (depletion (refractive index: 1.0) between organic EL element (refractive index: about 1.7) and inorganic fluorescent layer (refractive index; about 2.3)). Therefore, light emitted from the organic EL element does not efficiently reach the inorganic fluorescent layer, which decreases the luminous efficiency of the fluorescent layer. In the case of a liquid crystal display apparatus, it becomes difficult to planarize the fluorescent layer and thus a liquid crystal layer cannot be formed (e.g., since the distance between electrodes that sandwich a liquid crystal layer varies and an electric field is not uniformly applied, the liquid crystal layer does not uniformly operates).

The fluorescent layer can be formed by a publicly known wet process, for example, a coating method such as a spin coating method, a dipping method, a doctor blade method, a discharge coating method, or a spray coating method or a printing method such as an ink-jet method, a letterpress printing method, an intaglio printing method, a screen printing method, or a microgravure coating method, using a coating solution for forming fluorescent layers, the solution being prepared by dissolving or dispersing the above fluorescent material and a resin material in a solvent. Alternatively, the fluorescent layer can be formed by subjecting the above fluorescent material to a publicly known dry process or a laser transfer method. Examples of the dry process include a resistance heating evaporation method, an electron beam (EB) deposition method, a molecular beam epitaxy (MBE) method, a sputtering method, and an organic vapor phase deposition (OVPD) method.

When a photosensitive resin is used as the above polymer material, the fluorescent layer can be patterned by a photolithography method.

Examples of the photosensitive resin include photosensitive resins having a reactive vinyl group (photo-curable resist materials), such as acrylic acid resins, methacrylic acid resins, polyvinyl cinnamate resins, and ebonite resins. These photosensitive resins may be used alone or in combination as a mixture of two or more. Alternatively, the fluorescent material can be directly patterned by a wet process such as an ink-jet method, a letterpress printing method, an intaglio printing method, or a screen printing method; a publicly known dry process such as a resistance heating evaporation method that uses a shadow mask, an electron beam (EB) deposition method, a molecular beam epitaxy (MBE) method, a sputtering method, or an organic vapor phase deposition (OVPD) method; or a laser transfer method.

The thickness of the fluorescent layer is normally about 100 nm to 100 μm and preferably 1 μm to 100 μm. If the thickness is less than 100 nm, blue light emitted from the excitation light source element cannot be sufficiently absorbed. Therefore, the luminous efficiency is decreased and the color purity may be degraded as a result of the mixing of a color of excitation light with the required color.

The thickness is preferably 1 μm or more in order to improve the absorption of light emitted from the excitation light source element and reduce the transmission of excitation light to such a degree that the color purity is not adversely affected. Even if the thickness is more than 100 μm, the efficiency does not increase because the excitation light emitted from the excitation light source element is already sufficiently absorbed. This only consumes the material, which means an increase in the material cost.

A light-absorbing layer is preferably formed between separately formed fluorescent layers. This increases the contrast.

The thickness of the light-absorbing layer is normally about 100 nm to 100 μm and preferably 100 nm to 10 μm. The thickness of the light-absorbing layer is preferably smaller than that of the fluorescent layer to efficiently output light emitted toward the side surfaces of the fluorescent layer to the outside by a reflection layer.

An optical reflection body is disposed on the side surfaces of the fluorescent layer, but not on the back surface and excitation-light-incidence surface of the fluorescent layer. The optical reflection body is a layer having properties in which fluorescence generated inside the fluorescent layer and emitted toward the side surfaces of the fluorescent layer, but not the back surface and excitation-light-incidence surface of the fluorescent layer, is output in a front direction (light-output direction).

More specifically, the optical reflection body has, for example, a structure in which a reflective resin film formed of a reflective metal powder composed of Al, Ag, Au, Cr, or an alloy thereof or a resin containing metal particles is formed. However, this embodiment is not limited thereto.

The upper surface of the fluorescent layer is preferably planarized by forming a planarizing film. This can prevent the occurrence of depletion between the excitation light source element and the fluorescent layer. Furthermore, the adhesiveness between the first substrate on which the excitation light source element is formed and the second substrate on which the fluorescent layer is formed can be increased.

A wavelength-selective layer (wavelength-selective transmission/reflection layer) may be stacked on the fluorescent layer. The wavelength-selective layer has properties of transmitting excitation light emitted from the excitation light source element and reflecting fluorescence emitted from the fluorescent layer.

More specifically, the wavelength-selective layer may be, for example, an inorganic material substrate composed of a dielectric multilayer film, metal thin film glass, or quartz or a plastic substrate composed of polyethylene terephthalate, polycarbazole, or polyimide. However, this embodiment is not limited thereto.

A low-refractive-index material layer is disposed between the fluorescent layer and the second substrate. The low-refractive-index material layer has properties of decreasing the incident angle of fluorescence that enters the second substrate among the fluorescence isotropically emitted from the fluorescent layer.

More specifically, the low-refractive-index material layer is composed of, for example, a fluorocarbon resin having a refractive index of about 1.35 to 1.4 or a silicone resin having a refractive index of about 1.4 to 1.5. However, this embodiment is not limited thereto.

A color filter is preferably disposed between the fluorescent layer and the second substrate on which the fluorescent layer is formed. A publicly known color filter can be used as the color filter. By disposing the color filter, the color purity of each of a red pixel, a green pixel, and a blue pixel can be increased. When a display apparatus is produced, the color reproduction region can be broadened.

A blue color filter formed on a blue fluorescent layer, a green color filter formed on a green fluorescent layer, and a red color filter formed on a red fluorescent layer absorb excitation light contained in natural light that excites each fluorescent body. Therefore, the emission of the fluorescent layer caused by natural light can be suppressed or prevented, and thus a decrease in the contrast can be suppressed or prevented. Furthermore, excitation light that is transmitted without being absorbed by the fluorescent layer can be prevented from leaking out by the presence of the blue color filter, the green color filter formed on the green fluorescent layer, and the red color filter formed on the red fluorescent layer. Therefore, a decrease in the color purity of emitted light caused by a color mixture of the excitation light and light emitted from the fluorescent layer can be prevented.

The excitation light source element used for exciting the fluorescent body preferably emits ultraviolet light or blue light. Examples of the excitation light source element include ultraviolet LEDs, blue LEDs, ultraviolet-light-emitting inorganic EL, blue-light-emitting inorganic EL, ultraviolet-light-emitting organic EL, and blue-light-emitting organic EL. However, this embodiment is not limited thereto. Furthermore, by directly performing switching of these light sources, ON/OFF of emission for displaying an image can be controlled. By disposing a layer having a shutter function, such as liquid crystal, between the fluorescent layer and the excitation light source element or the like and controlling the layer, ON/OFF of emission can also be controlled. Alternatively, by using both the layer having a shutter function, such as liquid crystal, and the excitation light source element, ON/OFF of emission can be controlled.

A publicly known ultraviolet LED, blue LED, ultraviolet-light-emitting inorganic EL, blue-light-emitting inorganic EL, ultraviolet-light-emitting organic EL, or blue-light-emitting organic EL can be used as the excitation light source element. The excitation light source element is not particularly limited and can be produced by a publicly known production method using a publicly known material. Herein, the ultraviolet light is preferably light having a main emission peak of 360 nm to 410 nm. The blue light is light having a main emission peak of 410 nm to 470 nm.

When an LED is used as the excitation light source element, a publicly known LED can be used, such as an ultraviolet-light-emitting inorganic LED or a blue-light-emitting inorganic LED. Such an LED is constituted by, for example, a substrate, a buffer layer, an n-type contact layer, an n-type cladding layer, an active layer, a p-type cladding layer, and a p-type contact layer, but is not limited thereto.

The active layer is a layer in which emission occurs due to recombination of electrons and holes. A publicly known active layer material for LEDs can be used as an active layer material for forming the active layer. Examples of an active layer material for ultraviolet light include AlGaN, InAlN, $In_aAl_bGa_{1-a-b}N$ ($0 \leq a$, $0 \leq b$, $a+b \leq 1$). An example of an active layer material for blue light is $In_zGa_{1-z}N$ ($0<z<1$). However, this embodiment is not limited thereto.

The active layer has a single quantum well structure or a multiple quantum well structure. The active layer having a quantum well structure may be of n-type or p-type, but a non-doped (no addition of impurities) active layer is preferably employed because the full width at half maximum of the emission wavelength is narrowed due to band-to-band emission and thus emitted light with high color purity is provided.

The active layer may be doped with a donor impurity and/or an acceptor impurity. In the case where the crystallinity of an active layer doped with an impurity is the same as that of a non-doped active layer, when the active layer is doped with a donor impurity, the band-to-band emission intensity can be further increased compared with a non-doped active layer.

When the active layer is doped with an acceptor impurity, the peak wavelength can be shifted to the lower energy side by about 0.5 eV from the peak wavelength of band-to-band emission, but the full width at half maximum is broadened.

When the active layer is doped with both an acceptor impurity and a donor impurity, the emission intensity can be further increased compared with the emission intensity of an active layer doped with only an acceptor impurity.

In particular, when an active layer doped with an acceptor impurity is formed, the conductivity type of the active layer is preferably set to be n-type by also performing doping with a donor impurity such as Si.

The n-type cladding layer can be formed of a publicly known n-type cladding layer material for LEDs. The n-type cladding layer may be constituted by a single layer or multiple layers. By forming the n-type cladding layer using an n-type semiconductor material having a band gap energy larger than that of the active layer, a potential barrier for holes is formed between the n-type cladding layer and the active layer. As a result, holes can be confined in the active layer. For example, the n-type cladding layer can be formed of n-type $In_xGa_{1-x}N$ ($0 \leq x<1$), but this embodiment is not limited thereto.

The p-type cladding layer can be formed of a publicly known p-type cladding layer material for LEDs. The p-type cladding layer may be constituted by a single layer or multiple layers. By forming the p-type cladding layer using a p-type semiconductor material having a band gap energy larger than that of the active layer, a potential barrier for electrons is formed between the p-type cladding layer and the active layer. As a result, electrons can be confined in the active layer. For example, the p-type cladding layer can be formed of $Al_yGa_{1-y}N$ ($0 \leq y \leq 1$), but this embodiment is not limited thereto.

The contact layer can be formed of a publicly known contact layer material for LEDs. For example, an n-type contact layer composed of n-type GaN can be formed as a layer which is in contact with the n-type cladding layer and on which an electrode is formed. A p-type contact layer composed of p-type GaN can be formed as a layer which is in contact with the p-type cladding layer and on which an electrode is formed. Herein, if a second n-type cladding layer or a second p-type cladding layer is formed of GaN, the above contact layer is not necessarily formed, and the second cladding layer can be treated as the contact layer.

Each of the above layers constituting an LED can be formed by a publicly known film formation process for LEDs, but this embodiment is not particularly limited thereto. For example, the above layer can be formed on a substrate such as a sapphire substrate (including C plane, A plane, and R plane), a SiC substrate (including 6H-SiC and 4H-SiC), a spinel substrate ($MgAl_2O_4$, particularly its (111) plane), a ZnO substrate, a Si substrate, a GaAs substrate, or another oxide single crystal substrate (e.g., NGO) by a vapor deposition method such as MOVPE (metal-organic vapor phase epitaxy), MBE (molecular beam epitaxy), or HDVPE (hydride vapor phase epitaxy).

When an organic EL element is used as the excitation light source element, a publicly known organic EL element can be used. The organic EL element includes a first electrode, a second electrode, and an organic EL layer containing an organic layer and located between the first and second electrodes, but is not limited to the structure. The organic layer contains at least an organic light emitting layer composed of an organic light emitting material.

A substrate used in the organic EL element may be, for example, an inorganic material substrate composed of glass or quartz; a plastic substrate composed of polyethylene terephthalate, polycarbazole, or polyimide; an insulating substrate such as a ceramic substrate composed of alumina; a metal substrate composed of aluminum (Al) or iron (Fe); a substrate obtained by coating the above substrate with an insulator composed of silicon oxide ($SiO_2$) or an organic insulating material; or a substrate obtained by subjecting a surface of a metal substrate composed of Al or the like to an insulating treatment by, for example, anodic oxidation. However, this embodiment is not limited to these substrates.

The plastic substrate or the metal substrate is preferably used to allow the formation of a curbed portion or a bent portion without applying a stress. Furthermore, a substrate obtained by coating a plastic substrate with an inorganic material or a substrate obtained by coating a metal substrate with an inorganic insulating material is more preferably used. The use of such a substrate can prevent the degradation of organic EL elements due to the permeation of moisture which occurs when a plastic substrate is used as a substrate of organic EL elements (it is known that organic EL elements are degraded with a small amount of moisture).

Moreover, a leak (short circuit) caused by a protrusion of a metal substrate when the metal substrate is used as a substrate of organic EL elements can be prevented (it is known that, since the thickness of organic EL elements is as extremely small as about 100 nm to 200 nm, a leak (short circuit) occurs at a pixel due to a protrusion).

When a TFT is formed, a substrate that is not melted or distorted at a temperature of 500° C. or less is preferably used. A generally used metal substrate has a thermal expansion coefficient different from that of glass and thus it is difficult to form a TFT on the metal substrate by known production equipment. However, by using a metal substrate composed of an iron-nickel alloy having a linear expansion coefficient of $1 \times 10^{-5}/°$ C. or less, which is substantially the same as the linear expansion coefficient of glass, a TFT can be formed on the metal substrate using known production equipment at low cost.

The plastic substrate has a low heat-resistant temperature. Therefore, by forming a TFT on a glass substrate and then transferring the TFT onto a plastic substrate, the TFT can be formed on the plastic substrate.

When light (excitation light) emitted from the organic EL layer is output from the side (second electrode side) opposite to the substrate, there are no limitations on the substrate. However, when light emitted from the organic EL layer is output from the substrate side, a transparent or semitransparent substrate needs to be used to output the light emitted from the organic EL layer.

A TFT that controls the emission of the organic EL element is formed on a substrate in advance before the organic EL element is formed and functions as a switching and driving device. A publicly known TFT is used as the TFT in this embodiment. In this embodiment, a metal-insulator-metal (MIM) diode can also be used instead of the TFT.

A TFT that can be used for active drive organic EL displays and organic EL display apparatuses can be formed by employing a publicly known material, structure, and formation method. Examples of the material for the active layer of the TFT include inorganic semiconductor materials such as amorphous silicon, polycrystalline silicon (polysilicon), microcrystalline silicon, and cadmium selenide; oxide semiconductor materials such as zinc oxide and indium oxide-gallium oxide-zinc oxide; and organic semiconductor materials such as polythiophene derivatives, thiophene oligomers, poly(p-phenylenevinylene) derivatives, naphthacene, and pentacene. Examples of the structure of the TFT include a staggered type, an inverted staggered type, a top gate type, and a coplanar type.

Examples of the formation method of the active layer constituting a TFT include (1) a method in which an amorphous silicon film formed by a plasma-enhanced chemical vapor deposition (PECVD) method is subjected to ion doping with impurities, (2) a method in which amorphous silicon is formed by a low pressure chemical vapor deposition (LPCVD) method that uses a silane ($SiH_4$) gas, the amorphous silicon is crystallized into polysilicon by a solid phase growth method, and then ion doping is performed by an ion implantation method, (3) a method in which amorphous silicon is formed by an LPCVD method that uses a $Si_2H_6$ gas or a PECVD method that uses a $SiH_4$ gas, the amorphous silicon is annealed by using a laser such as an excimer laser and crystallized into polysilicon, and then ion doping is performed (low-temperature process), (4) a method in which a polysilicon layer is formed by an LPCVD method or a PECVD method and thermally oxidized at 1000° C. or more to form a gate insulating film, a gate electrode composed of $n^+$ polysilicon is formed thereon, and then ion doping is performed (high-temperature process), (5) a method in which an organic semiconductor material is formed by an ink-jet method or the like, and (6) a method in which a single crystal film of an organic semiconductor material is obtained.

A gate insulating film of the TFT can be formed of a publicly known material. Examples of the material include $SiO_2$ formed by a PECVD method or an LPCVD method and $SiO_2$ obtained by thermally oxidizing a polysilicon film. A signal electrode line, a scanning electrode line, a common electrode line, a first driving electrode, and a second driving electrode of the TFT used in this embodiment can each be formed of a publicly known material such as tantalum (Ta), aluminum (Al), or copper (Cu). A TFT for an organic EL panel according to this embodiment can be formed so as to have the above structure, but is not limited to the materials, structures, and formation methods.

An interlayer insulating film that can be used for active drive organic EL displays and organic EL display apparatuses can be formed of a publicly known material. Examples of the material for the interlayer insulating film include inorganic materials such as silicon oxide ($SiO_2$), silicon nitride (SiN or $Si_2N_4$), and tantalum oxide (TaO or $Ta_2O_5$); and organic materials such as an acrylic resin and a resist material. The interlayer insulating film can be formed by a dry process such as a chemical vapor deposition (CVD) method or a vacuum deposition method or a wet process such as a spin coating method. The interlayer insulating film can also be patterned by a photolithography method, when necessary.

When light (excitation light) emitted from the organic EL layer is output from the side (second electrode side) opposite to the substrate, a light-shielding insulating film having light-shielding properties is preferably used in order to prevent a change in the TFT characteristics caused when natural light enters a TFT formed on the substrate. The interlayer insulating film and the light-shielding insulating film can be used in combination. The light-shielding interlayer insulating film is composed of a product obtained by dispersing a pigment or dye such as phthalocyanine or quinacridone in a polymer resin such as polyimide, a color resist, a black matrix material, or an inorganic insulating material such as $Ni_xZn_yFe_2O_4$. However, this embodiment is not limited to the materials and formation methods.

When a TFT or the like is formed on a substrate in the active drive organic EL display apparatus, projections and depressions are formed in the surface, which may cause defects of an organic EL element (e.g., the partial loss of a pixel electrode, the partial loss of an organic EL layer, the disconnection of a counter electrode, the short circuit between an pixel electrode and a counter electrode, and the decrease in withstand voltage). A planarizing film may be formed on the interlayer insulating film to prevent these defects.

Such a planarizing film can be formed of a publicly known material. Examples of the material include inorganic materials such as silicon oxide, silicon nitride, and tantalum oxide and organic materials such as polyimide, an acrylic resin, and a resist material. The planarizing film is formed by a dry process such as a CVD method or a vacuum deposition method or a wet process such as a spin coating method. However, this embodiment is not limited to the materials and formation methods. The planarizing film may have a single-layer structure or a multi-layer structure.

The first electrode and the second electrode function in a pair as an anode or cathode of the organic EL element. In other words, when the first electrode is an anode, the second electrode is a cathode. When the first electrode is a cathode, the second electrode is an anode. Specific compounds and formation methods are shown below, but this embodiment is not limited to the materials and formation methods.

The first electrode and second electrode can be formed of a publicly known electrode material. The electrode material for forming an anode is, for example, a transparent electrode material such as a metal, e.g., gold (Au), platinum (Pt), or nickel (Ni), an oxide (ITO) of indium (In) and tin (Sn), an oxide ($SnO_2$) of tin (Sn), or an oxide (IZO) of indium (In) and zinc (Zn), which has a work function of 4.5 eV or more, from the viewpoint of efficiently performing the injection of holes into the organic EL layer.

The electrode material for forming a cathode is, for example, a metal such as lithium (Li), calcium (Ca), cerium (Ce), barium (Ba), or aluminum (Al), or an alloy containing these metals, such as a Mg:Al alloy or a Li:Al alloy, which has a work function of 4.5 eV or less, from the viewpoint of efficiently performing the injection of electrons into the organic EL layer.

The first electrode and second electrode can be formed using the above materials by a publicly known method such as an EB deposition method, a sputtering method, an ion plating method, or a resistance heating evaporation method, but this embodiment is not limited to the formation methods. If necessary, the formed electrodes can be patterned by a photolithography method or a laser lift-off method. Alternatively, a directly patterned electrode can also be formed by using a shadow mask in combination. The thickness is preferably 50 nm or more. If the thickness is less than 50 nm, the wiring resistance increases, which may increase the driving voltage.

In the case where a micro-cavity effect is used in order to improve the color purity, luminous efficiency, and front luminance, when the light emitted from the organic EL layer is output from the first electrode side (second electrode), a semitransparent electrode is preferably used as the first electrode (second electrode). A metal material for the semitransparent electrode by itself or a combination of a metal material for the semitransparent electrode and a metal material for the transparent electrode can be used. Silver is preferably used as the semitransparent electrode material from the viewpoint of reflectance and transmittance.

The thickness of the semitransparent electrode is preferably 5 nm to 30 nm. If the thickness is less than 5 nm, light is not sufficiently reflected and the interference effect cannot be sufficiently produced. If the thickness is more than 30 nm, the transmittance of light considerably decreases, which may decrease the luminance and efficiency.

An electrode having high reflectance of light is preferably used as the second electrode (first electrode). Examples of the electrode material used herein include reflective metal electrode materials such as aluminum, silver, gold, an aluminum-lithium alloy, an aluminum-neodymium alloy, or an aluminum-silicon alloy and electrode materials obtained by combining a transparent electrode material and the reflective metal electrode (reflective electrode) material.

The organic EL layer may have a single-layer structure including an organic light emitting layer or a multi-layer structure including an organic light emitting layer and a charge transport layer. Specifically, the following structures are listed, but the present invention is not limited to these structures.

(1) organic light emitting layer
(2) hole transport layer/organic light emitting layer
(3) organic light emitting layer/electron transport layer
(4) hole transport layer/organic light emitting layer/electron transport layer
(5) hole injection layer/hole transport layer/organic light emitting layer/electron transport layer
(6) hole injection layer/hole transport layer/organic light emitting layer/electron transport layer/electron injection layer
(7) hole injection layer/hole transport layer/organic light emitting layer/hole blocking layer/electron transport layer
(8) hole injection layer/hole transport layer/organic light emitting layer/hole blocking layer/electron transport layer/electron injection layer
(9) hole injection layer/hole transport layer/electron blocking layer/organic light emitting layer/hole blocking layer/electron transport layer/electron injection layer Each of the organic light emitting layer, hole injection layer, hole transport layer, hole blocking layer, electron blocking layer, electron transport layer, and electron injection layer may have a single-layer structure or a multi-layer structure.

The organic light emitting layer may be composed of only an organic light emitting material shown below. The organic light emitting layer may be formed by a combination of a light emitting dopant and a host material and may optionally include a hole transport material, an electron transport material, and additives (e.g., donor and acceptor). The organic light emitting layer 23 may have a structure in which the material shown below is dispersed in a polymer material (binder resin) or an inorganic material.

From the viewpoint of luminous efficiency and life, the organic light emitting layer preferably has a structure in which a light emitting dopant is dispersed in a host material.

A publicly known light emitting material for organic EL can be used as the organic light emitting material. Such an organic light emitting material is classified into a low-molecular-weight light emitting material and a high-molecular-weight light emitting material. Specific compounds thereof are shown below, but this embodiment is not limited to these materials. The light emitting material may be classified into a fluorescent material and a phosphorescent material. A phosphorescent material having high luminous efficiency is preferably used from the viewpoint of decreasing the power consumption.

Specific compounds thereof are shown below, but this embodiment is not limited to these materials.

A publicly known dopant material for organic EL can be used as the light emitting dopant optionally contained in the organic light emitting layer. Such a dopant material is shown below. Examples of an ultraviolet-light-emitting material include fluorescent light emitting materials such as p-quaterphenyl, 3,5,3,5-tetra-t-butylsexiphenyl, and 3,5,3,5-tetra-t-butyl-quinquephenyl. Examples of a blue-light-emitting material include fluorescent light emitting materials such as styryl derivatives and phosphorescent-light-emitting organic metal complexes such as bis[(4,6-difluorophenyl)-pyridinato-N,C2']picolinate iridium (III) (FIrpic) and bis(4',6'-difluorophenylpyridinato)tetrakis(1-pyrazoyl)borate iridium (III) (FIr6).

A publicly known host material for organic EL can be used as the host material in use of the dopant. Examples of the host material include the above-described low-molecular-weight light emitting materials and high-molecular-weight light emitting materials; carbazole derivatives such as 4,4'-bis(carbazole)biphenyl, 9,9-di(4-dicarbazole-benzyl)fluorene (CPF), 3,6-bis(triphenylsilyl)carbazole (mCP), and (PCF); aniline derivatives such as 4-(diphenylphosphoryl)-N,N-diphenylaniline (HM-A1); and fluorene derivatives such as 1,3-bis(9-phenyl-9H-fluoren-9-yl)benzene (mDPFB) and 1,4-bis(9-phenyl-9H-fluoren-9-yl)benzene (pDPFB).

A charge injection/transport layer is classified into a charge injection layer (hole injection layer, electron injection layer) and a charge transport layer (hole transport layer, electron transport layer) in order to more efficiently perform the injection of charges (holes, electrons) from the electrode and the transport (injection) into the light emitting layer. The charge injection/transport layer may be composed of only a charge injection/transport material shown below. The charge injection/transport layer may optionally contain additives (e.g., donor and acceptor). The charge injection/transport layer may have a structure in which a charge injection/transport material shown below is dispersed in a polymer material (binder resin) or an inorganic material.

A publicly known charge transport material for organic EL or organic photoconductors can be used as the charge injection/transport material. Such a charge injection/transport material is classified into a hole injection/transport material and an electron injection/transport material. Specific compounds thereof are shown below, but this embodiment is not limited to these materials.

Examples of the hole injection material and hole transport material include low-molecular-weight materials, for example, oxides such as vanadium oxide ($V_2O_5$) and molybdenum oxide ($MoO_2$), inorganic p-type semiconductor materials, porphyrin compounds, aromatic tertiary amine compounds such as N,N'-bis(3-methylphenyl)-N,N'-bis(phenyl)-benzidine (TPD) and N,N'-di(naphthalen-1-yl)-N,N'-diphenyl-benzidine (NPD), hydrazone compounds, quinacridone compounds, and styrylamine compounds; and high-molecular-weight materials such as polyaniline (PANI), polyaniline-camphorsulfonic acid (PANI-CSA), 3,4-polyethylenedioxythiophene/polystyrene sulfonate (PEDOT/PSS), poly(triphenylamine) derivatives (Poly-TPD), polyvinylcarbazole (PVCz), poly(p-phenylenevinylene) (PPV), and poly(p-naphthalenevinylene) (PNV).

A material having an energy level of the highest occupied molecular orbital (HOMO) lower than the energy level of a hole injection/transport material used in the hole transport layer is preferably used as the material for the hole injection layer from the viewpoint of more efficiently performing the injection and transport of holes from the anode. The hole transport layer is preferably composed of a material having the mobility of holes higher than that of the hole injection/transport material used in the hole injection layer.

The hole injection material and hole transport material are preferably doped with an acceptor to improve the hole injection and transport performance. A publicly known acceptor material for organic EL can be used for the acceptor. Specific compounds thereof are shown below, but this embodiment is not limited to these materials.

Examples of the acceptor material include inorganic materials such as Au, Pt, W, Ir, $POCl_3$, $AsF_6$, Cl, Br, I, vanadium oxide ($V_2O_5$), and molybdenum oxide ($MoO_2$); compounds having a cyano group, such as TCNQ (7,7,8,8-tetracyanoquinodimethane), $TCNQF_4$ (tetrafluorotetracyanoquinodimethane), TCNE (tetracyanoethylene), HCNB (hexacyanobutadiene), and DDQ (dicyclodicyanobenzoquinone); compounds having a nitro group, such as TNF (trinitrofluorene) and DNF (dinitrofluorene); and organic materials such as fluoranil, chloranil, and bromanil.

Among them, compounds having a cyano group, such as TCNQ, $TCNQF_4$, TCNE, HCNB, and DDQ, are preferably used because they can more effectively increase the carrier density.

Examples of the electron injection material and electron transport material include low-molecular-weight materials such as n-type semiconductor inorganic materials, oxadiazole derivatives, triazole derivatives, thiopyrazine dioxide derivatives, benzoquinone derivatives, naphthoquinone derivatives, anthraquinone derivatives, diphenoquinone derivatives, fluorenone derivatives, and benzodifuran derivatives; and high-molecular-weight materials such as poly(oxadiazole) (Poly-OXZ) and polystyrene derivatives (PSS). In particular, examples of the electron injection material include fluorides such as lithium fluoride (LiF) and barium fluoride ($BaF_2$) and oxides such as lithium oxide ($Li_2O$).

A material having an energy level of the lowest unoccupied molecular orbital (LUMO) higher than the energy level of an electron injection/transport material used in the electron transport layer is preferably used as the material for the electron injection layer from the viewpoint of more efficiently performing the injection and transport of electrons from the cathode. The electron transport layer is preferably composed of a material having the mobility of electrons higher than that of the electron injection/transport material used in the electron injection layer.

The electron injection material and electron transport material are preferably doped with a donor to improve the electron injection and transport performance. A publicly known donor material for organic EL can be used for the donor. Specific compounds thereof are shown below, but this embodiment is not limited to these materials.

Examples of the donor material include inorganic materials such as alkali metals, alkaline-earth metals, rare-earth elements, Al, Ag, Cu, and In; compounds having an aromatic tertiary amine in their skeleton, such as anilines, phenylenediamines, benzidines (e.g., N,N,N',N'-tetraphenylbenzidine, N,N'-bis(3-methylphenyl)-N,N'-bis(phenyl)benzidine, and N,N'-di(naphthalen-1-yl)-N,N'-diphenylbenzidine), triphenylamines (e.g., triphenylamine, 4,4',4"-tris(N,N-diphenylamino)triphenylamine, 4,4',4"-tris(N-3-methylphenyl-N-phenylamino)triphenylamine, and 4,4',4"-tris(N-(1-naphthyl)-N-phenylamino)triphenylamine), and triphenyldiamines (N,N'-di(4-methylphenyl)-N,N'-diphenyl-1,4-phenylenediamine); fused polycyclic compounds such as phenanthrene, pyrene, perylene, anthracene, tetracene, and pentacene (the fused polycyclic compounds may have a substituent); and organic materials such as TTF (tetrathiafulvalene), dibenzofuran, phenothiazine, and carbazole. Among them, compounds having an aromatic tertiary amine in their skeleton, fused polycyclic compounds, and alkali metals are preferably used because they can more effectively increase the carrier density.

Each of the organic EL layers such as the light emitting layer, the hole transport layer, the electron transport layer, the hole injection layer, and the electron injection layer can be formed by a publicly known wet process, for example, a coating method such as a spin coating method, a dipping method, a doctor blade method, a discharge coating method, or a spray coating method or a printing method such as an ink-jet method, a letterpress printing method, an intaglio printing method, a screen printing method, or a microgravure coating method, using a coating solution for forming the organic EL layer, the coating solution being prepared by dissolving or dispersing the above material in a solvent; by a publicly known dry process in which the above material is subjected to a resistance heating evaporation method, an electron beam (EB) deposition method, a molecular beam epitaxy (MBE) method, a sputtering method, or an organic vapor phase deposition (OVPD) method; or by a laser transfer method. When the organic EL layer is formed by the wet process, the coating solution for forming organic EL layers may contain additives for adjusting the physical properties of the coating solution, such as a leveling agent and a viscosity modifier.

The thickness of each of the organic EL layers is normally about 1 nm to 1000 nm and preferably 10 nm to 200 nm. If the thickness is less than 10 nm, the required physical properties (the charge injection, transport, and confinement properties) are not achieved. Furthermore, pixel defects may be caused due to foreign matter such as dust. If the thickness is more than 200 nm, the driving voltage increases due to resistance components in the organic EL layers, which increases the power consumption.

The organic EL display and the organic EL display apparatus preferably have an edge cover between the first electrode and the second electrode for the purpose of preventing the leakage between the first electrode and the second electrode in an edge portion of the first electrode formed on the substrate side. The edge cover can be formed of an insulating material by a publicly known method such as an EB deposition method, a sputtering method, an ion plating method, or a resistance heating evaporation method and can also be patterned by a publicly known dry or wet photolithography method, but this embodiment is not limited to these formation methods.

A publicly known material can be used as a material for the insulating layer. The material is not particularly limited in this embodiment, but needs to transmit light. Examples of the material include SiO, SiON, SiN, SiOC, SiC, HfSiON, ZrO, HfO, and LaO. The thickness of the insulating layer is preferably 100 nm to 2000 nm. If the thickness is 100 nm or less, the insulating property is not sufficiently provided and the leakage occurs between the first electrode and the second electrode. This increases the power consumption and causes no emission of light.

If the thickness is 2000 nm or more, it takes a lot of time for the film formation process, which decreases the productivity and causes the disconnection of the second electrode at the edge cover.

The organic EL element preferably has a micro-cavity structure (optical micro-cavity structure) provided by a dielectric multilayer film or an interference effect between a reflective electrode and a semitransparent electrode used as electrodes constituted by the anode and cathode. This allows the concentration of the light emitted from the organic EL element in the front direction (providing directivity), a reduction in the emission loss of light that escapes to the surroundings, and an increase in the luminous efficiency at the front.

Thus, the emission energy generated in the light emitting layer of the organic EL element can be efficiently transferred to the fluorescent layer and also the front luminance can be increased. The emission spectrum can also be adjusted due to the interference effect. The emission spectrum can be adjusted by controlling the emission peak wavelength and full width at half maximum to be desired values. Therefore, a spectrum in which the red and green fluorescent bodies can be more effectively excited can be provided in a controlled manner and the color purity of blue pixels can be improved.

The organic EL element is electrically connected to external driving circuits (scanning line electrode circuit, data signal electrode circuit, and power supply circuit) to perform driving.

The substrate constituting the organic EL element is a glass substrate, preferably a metal substrate or a plastic substrate, and more preferably a substrate obtained by coating a metal substrate or a plastic substrate with an insulating material.

The organic EL element may be directly connected to an external circuit to perform driving. Alternatively, a switching circuit such as a TFT is disposed in a pixel and a wiring line to which the TFT is connected may be electrically connected to external driving circuits (scanning line electrode circuit (source driver), data signal electrode circuit (gate driver), and power supply circuit) for driving the light source.

In an active substrate constituting a light source of the active drive display apparatus, a plurality of scanning signal lines, a plurality of data signal lines, and a plurality of TFTs located at intersections between the scanning signal lines and the data signal lines are disposed on a glass substrate, preferably on a metal substrate or a plastic substrate, and more preferably on a substrate obtained by coating a metal substrate or a plastic substrate with an insulating material.

Such an organic EL element is driven by a voltage drive digital gray scale method and two TFTs for switching and driving are disposed in each pixel. The TFT for driving and the first electrode of the EL element are electrically connected to each other through a contact hole made in a planarizing layer. A capacitor for controlling the gate potential of the TFT for driving to be a constant potential is disposed in each pixel so as to be connected to a gate portion of the TFT for driving.

However, this embodiment is not limited thereto. The above-described voltage drive digital gray scale method may be employed or a current drive analog gray scale method may be employed. The number of TFTs is also not particularly limited. The organic EL element may be driven by using the above-described two TFTs or the organic EL element may be driven by using two or more TFTs including a building-out circuit in a pixel, which is a conventional organic EL element, for the purpose of preventing the variation in TFT characteristics (mobility, threshold voltage).

When an inorganic EL element is used as the excitation light source element, an ultraviolet-light-emitting inorganic EL element or a blue-light-emitting inorganic EL element is constituted by, for example, a substrate, a first electrode, a first dielectric layer, a light emitting layer, a second dielectric layer, and a second electrode, but is not limited thereto.

The substrate used in the inorganic EL element may be, for example, an inorganic material substrate composed of glass or quartz; a plastic substrate composed of polyethylene terephthalate, polycarbazole, or polyimide; an insulating substrate such as a ceramic substrate composed of alumina; a metal substrate composed of aluminum (Al) or iron (Fe); a substrate obtained by coating the above substrate with an insulator composed of silicon oxide ($SiO_2$) or an organic insulating material; or a substrate obtained by subjecting a surface of a metal substrate composed of Al or the like to an insulating treatment by, for example, anodic oxidation. However, this embodiment is not limited to these substrates.

The plastic substrate or the metal substrate is preferably used to allow the formation of a curbed portion or a bent portion without applying a stress. Furthermore, a substrate obtained by coating a plastic substrate with an inorganic material or a substrate obtained by coating a metal substrate with an inorganic insulating material is more preferably used.

Examples of a transparent electrode material for the first and second electrodes of the inorganic EL element include metals such as aluminum (Al), gold (Au), platinum (Pt), and nickel (Ni); an oxide (ITO) of indium (In) and tin (Sn); an oxide ($SnO_2$) of tin (Sn); and an oxide (IZO) of indium (In) and zinc (Zn). However, this embodiment is not limited to these materials. An electrode disposed in a direction in which light is output may be a transparent electrode composed of ITO or the like. An electrode disposed in a direction opposite to the direction in which light is output is preferably a reflective film composed of aluminum or the like.

The first electrode and the second electrode can be formed of the above material by a publicly known method such as an EB deposition method, a sputtering method, an ion plating method, or a resistance heating evaporation method, but this embodiment is not limited to the formation methods. If necessary, the formed electrodes can be patterned by a photolithography method or a laser lift-off method. Alternatively, a directly patterned electrode can also be formed by using a shadow mask in combination. The thickness is preferably 50 nm or more. If the thickness is less than 50 nm, the wiring resistance increases, which may increase the driving voltage.

A publicly known dielectric material for inorganic EL can be used for the first and second dielectric layers. Examples of the dielectric material include tantalum pentoxide ($Ta_2O_5$), silicon oxide ($SiO_2$), silicon nitride ($Si_3N_4$), aluminum oxide ($Al_2O_3$), aluminum titanate ($AlTiO_3$), barium titanate ($BaTiO_3$), and strontium titanate ($SrTiO_3$). However, this embodiment is not limited thereto. The first and second dielectric layers may be composed of one dielectric material selected from the above dielectric materials or may have a layered structure of two or more of the dielectric materials. The thickness of the dielectric layers is preferably about 200 nm to 500 nm.

A publicly known light emitting material for inorganic EL can be used for the light emitting layer. Examples of the light emitting material include ultraviolet-light-emitting materials such as $ZnF_2$:Gd; and blue-light-emitting materials such as $BaAl_2S_4$:Eu, $CaAl_2S_4$:Eu, $ZnAl_2S_4$:Eu, $Ba_2SiS_4$:Ce, ZnS:Tm, SrS:Ce, SrS:Cu, CaS:Pb, and $(Ba,Mg)Al_2S_4$:Eu. However, this embodiment is not limited thereto. The thickness of the light emitting layer is preferably about 300 nm to 1000 nm.

The inorganic EL element preferably includes a sealing film or a sealing substrate. Such a sealing film or a sealing substrate can be obtained by employing a publicly known sealing material and sealing method. Specifically, a sealing film can be obtained by applying a resin onto a surface of the light source on the side opposite to the substrate by a spin coating method, ODF, or a laminating method. Alternatively, a sealing film can be obtained by forming an inorganic film composed of SiO, SiON, SiN, or the like by a plasma CVD method, an ion plating method, an ion beam method, or a sputtering method and then applying a resin by a spin coating method, ODF, or a laminating method or performing bonding. The sealing film can prevent oxygen and moisture from entering the light emitting element from the outside, which increases the life of the light source.

When the excitation light source element and the fluorescent substrate (second substrate) are connected to each other, they can be bonded to each other with a publicly known ultraviolet-curable resin or thermosetting resin. When the excitation light source element is directly formed on the fluorescent substrate, there is employed a method in which an inert gas such as nitrogen gas or argon gas is sealed with glass, metal, or the like. Furthermore, for example, a moisture absorbent such as barium oxide is preferably mixed in the sealed inert gas because the degradation of the excitation light source element (e.g., organic EL element) due to moisture can be more effectively reduced. This embodiment is not limited to these materials and formation methods. Since emitted light is output from the second substrate, a light-transparent material needs to be used for the sealing film.

When the light emitting device including the above excitation light source element is applied to a display apparatus, a polarizing plate is preferably disposed on the light-output side. A combination of a publicly known linear polarizing plate and a λ/4 plate can be used as the polarizing plate. By disposing such a polarizing plate, natural light reflection from the electrode of the display apparatus and natural light reflection at the surface of the substrate or sealing substrate can be prevented, which improves the contrast of the display apparatus.

In a display apparatus including a liquid crystal element between the fluorescent layer and the excitation light source element, a publicly known liquid crystal element can be applied as the liquid crystal element. For example, the liquid crystal element includes a liquid crystal cell and a pair of polarizing plates that sandwich the liquid crystal cell, but is not limited thereto.

In the liquid crystal cell, liquid crystal is held between two electrode substrates. In some cases, an optically anisotropic layer is disposed between the liquid crystal cell and one of the polarizing plates or two optically anisotropic layers are disposed between the liquid crystal and both the polarizing plates.

The liquid crystal element functions as an optical shutter that selectively transmits the light emitted from the excitation light source element.

The type of liquid crystal cell is not particularly limited and can be suitably selected in accordance with the application. Examples of the type of liquid crystal cell include a TN mode, a VA mode, an OCB mode, an IPS mode, and an ECB mode.

The liquid crystal element may undergo passive driving or active driving that uses a switching element such as a TFT.

The switching of the liquid crystal element and the switching of the light source are preferably combined with each other because the power consumption can be further reduced.

Figure 7:
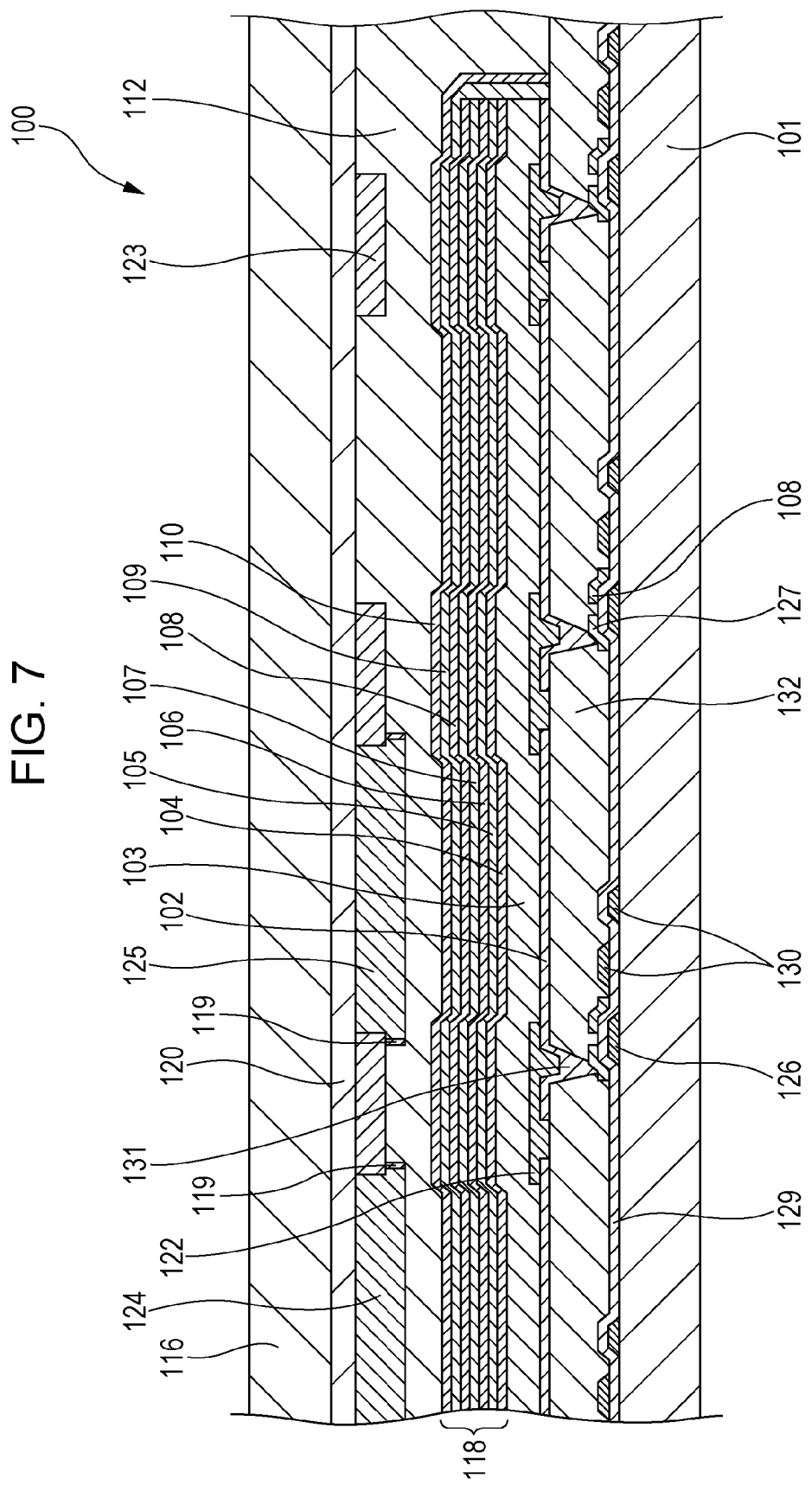
FIG. 7 is a cross-sectional view showing an active-matrix drive organic EL display, which is an example of a display apparatus including a light emitting device.

FIG. 7 is a cross-sectional view showing an active-matrix drive organic EL display, which is an example of a display apparatus including the light emitting device of this embodiment.

In an organic EL display 100, a TFT, which is an active drive element, is formed on one surface of a substrate 101. The TFT is constituted by a gate electrode 126, a drain electrode 108, a source electrode 127, a gate insulating film 129, a wiring line 130, and a through-hole 131.

An excitation light source element 118 is constituted by an anode 102, an edge cover 122, a hole injection layer 103, a hole transport layer 104, an electron blocking layer 105, a light emitting layer 106, a hole blocking layer 107, an electron transport layer 108, an electron injection layer 109, and a cathode 110.

A sealing layer 112 is formed on the excitation light source element 118. On the other hand, a red-light-emitting fluorescent layer 124 and a green-light-emitting fluorescent layer 125 defined by a low-refractive-index material layer 120, an optical reflective film 119, and a light-absorbing layer 123 are formed on a sealing substrate (second substrate) 116. The sealing substrate 116 and the substrate 101 are bonded to each other through the sealing layer 112.

Figure 8:
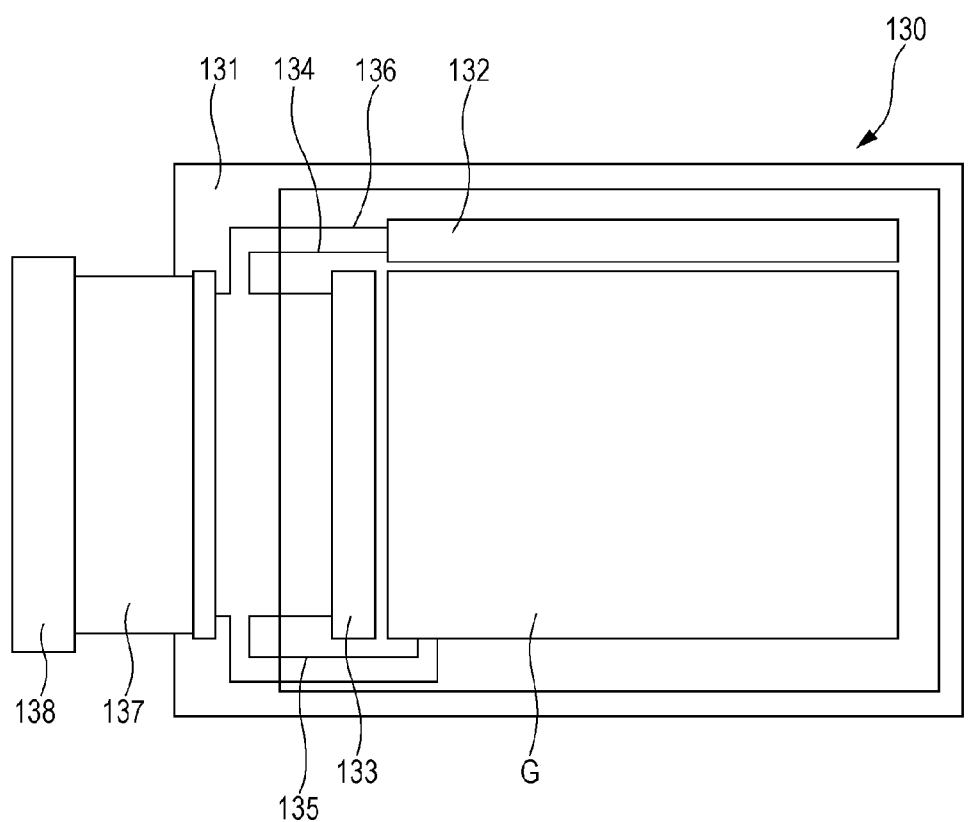
FIG. 8 is a schematic view showing an example of a structure of a control portion in a display apparatus.

FIG. 8 is a schematic view showing an example of a structure of a control portion in a display apparatus.

A display apparatus 130 includes a first substrate 131, a pixel section G, a gate signal driving circuit 132, a data signal driving circuit 133, a wiring line 134, a current supplying line 135, a second substrate (sealing substrate) 136, a FPC (flexible printed circuit) 137, and an external driving circuit 138.

The external driving circuit 138 operates such that scanning lines in the pixel section G are successively selected by the gate signal driving circuit 132 and pixel data is written, by the data signal driving circuit 133, to each of pixel elements disposed along the selected scanning lines. In other words, the scanning lines are successively driven by the gate signal driving circuit 132 and pixel data is output to the data lines by the data signal driving circuit 133, whereby pixel elements located at the intersections between the driven scanning lines and the data lines to which the data is output are driven.

Figure 9:
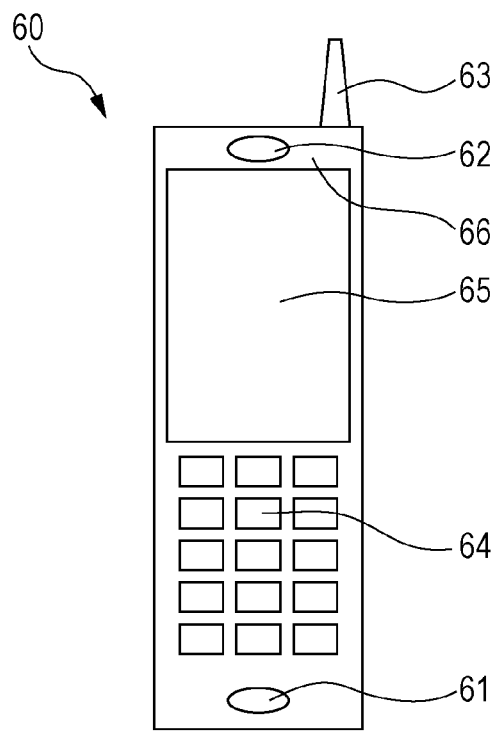
FIG. 9 is an external view showing a cellular phone, which is an application example of the light emitting device of the present invention.

The display apparatus according to an embodiment of the present invention can be applied to, for example, a cellular phone shown in FIG. 9.

A cellular phone 60 shown in FIG. 9 includes a voice input unit 61, a voice output unit 62, an antenna 63, operation switches 64, a display unit 65, and a casing 66. The display apparatus of this embodiment can be suitably applied as the display unit 61. By applying the display apparatus according to an embodiment of the present invention to the display unit 65 of the cellular phone 60, a screen image having high contrast can be displayed with low power consumption.

Figure 10:
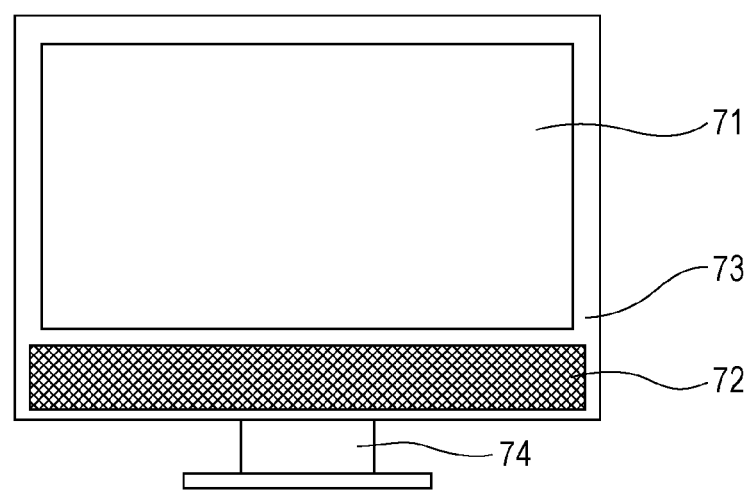
FIG. 10 is an external view showing a flat panel television, which is an application example of the light emitting device of the present invention.

The display apparatus according to an embodiment of the present invention can also be applied to, for example, a flat panel television shown in FIG. 10. A flat panel television 70 shown in FIG. 10 includes a display unit 71, a speaker 72, a cabinet 73, and a stand 74. The display apparatus of this embodiment can be suitably applied as the display unit 71. By applying the display apparatus according to an embodiment of the present invention to the display unit 71 of the flat panel television 70, a screen image having high contrast can be displayed with low power consumption.

Figure 11:
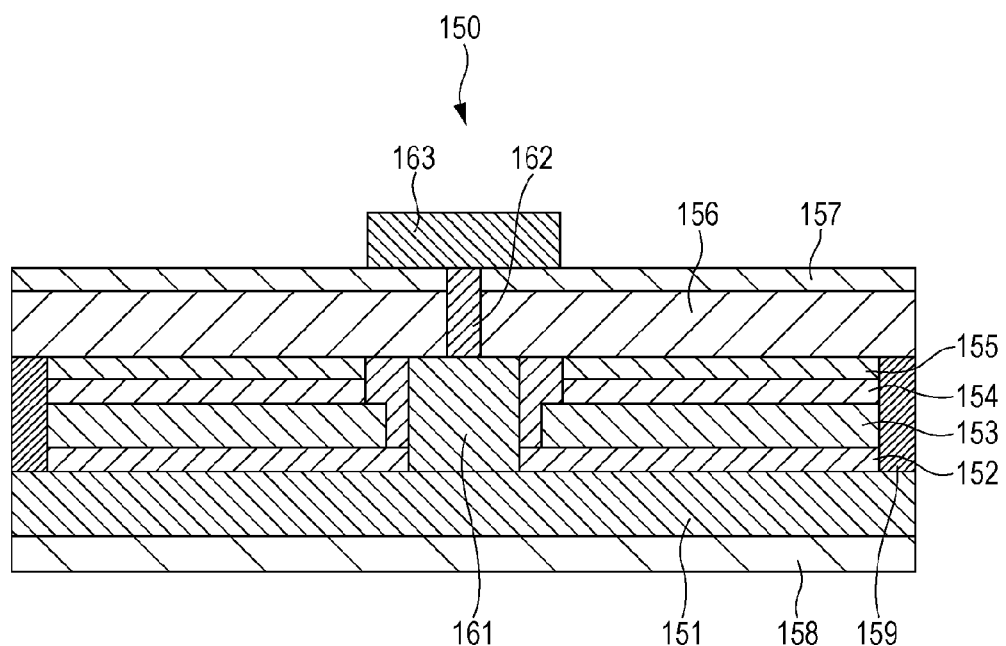
FIG. 11 is a cross-sectional view showing a ceiling light, which is an application example of the light emitting device of the present invention.

FIG. 11 is a cross-sectional view showing a ceiling light, which is an example of an illuminating apparatus including the light emitting device of this embodiment. A ceiling light 150 shown in FIG. 11 includes a first electrode (anode) 152, an organic EL element 153, a second electrode (cathode) 154, a thermal diffusion sheet 155, a second substrate (sealing substrate) 156, and a heat dissipation layer 157 which are formed on a first substrate 151 in that order.

An optical film 158 is formed on the light-output side of the first substrate 151.

A sealing resin 159 is formed on both ends of such a layered body, and a driving circuit 161 and a wiring line 162 connected to the driving circuit 161 are formed in the central region of the layered body. The ceiling light 150 is hung from, for example, the ceiling of a room using a hook ceiling member 163 and can be used as an indoor illuminating apparatus.

By applying the light emitting device according to an embodiment of the present invention to the ceiling light 150, bright illumination light can be obtained with low power consumption. Accordingly, an illuminator that can undergo surface emission at constant luminous intensity with high color purity can be realized.

EXAMPLES

Specific examples according to an aspect of the present invention and publicly known comparative examples will now be described, but the aspect of the present invention is not limited to the examples.

Comparative Example 1

A glass plate having a thickness of 0.7 mm was used as a substrate. The glass plate was washed with water; then subjected to ultrasonic cleaning with pure water for 10 minutes, ultrasonic cleaning with acetone for 10 minutes, and steam cleaning with isopropyl alcohol for 5 minutes; and dried at 100° C. for one hour.

A green fluorescent layer having a thickness of 100 μm was formed on the substrate.

The green fluorescent layer was formed as follows. First, 15 g of ethanol and 0.22 g of γ-glycidoxypropyltriethoxysilane were added to 0.16 g of Aerosil having an average particle size of 5 nm and stirred in an open system at room temperature for one hour. This mixture and 20 g of a green fluorescent body $Ca_{0.97}Mg_{0.03}:ZrO_3:Ho$ were transferred into a mortar and thoroughly mixed by grinding. The resultant mixture was heated in an oven at 70° C. for two hours and further heated in an oven at 120° C. for two hours to obtain surface modified $Ba_2SiO_4:Eu^{2+}$. Subsequently, 30 g of polyvinyl alcohol dissolved in a mixed solution (300 g) of water/dimethyl sulfoxide=1/1 was added to 10 g of surface modified $Ca_{0.97}Mg_{0.03}:ZrO_3:Ho$ and stirred with a dispersing device to prepare a coating solution for forming green fluorescent bodies. The thus-prepared coating solution for forming green fluorescent bodies was applied onto the glass substrate at a desired position with a width of 3 mm by a screen printing method. The glass substrate was dried by heating in a vacuum oven (200° C., 10 mmHg) for four hours to form a green fluorescent layer. Thus, a fluorescent substrate was completed.

When blue LED light with a wavelength of 450 nm was made to enter as excitation light from the back of the fluorescent substrate while the side surfaces of the fluorescent layer were covered with a light-shielding film, it was confirmed that fluorescence was output from the side surfaces of the substrate and the surroundings of the substrate became blurred when the fluorescent substrate was viewed from the front.

The luminance conversion efficiency of the fluorescent substrate at 25° C. concerning fluorescence output from the front when blue LED light with a wavelength of 450 nm was made to enter as excitation light from the back of the fluorescent substrate was measured using a commercially available luminance meter (BM-7 manufactured by TOPCON TECHNOHOUSE CORPORATION). The luminance of the blue LED light serving as excitation light was 1000 cd/m$^2$ whereas the luminance of green light emitted from the fluorescent body and having an emission peak wavelength of 547 nm was 1023 cd/m$^2$. As a result, the luminance conversion efficiency was 100%.

Comparative Example 2

A low-refractive-index material film was formed on the same glass substrate as in Comparative Example 1. A fluorocarbon resin having a refractive index of about 1.35 to 1.4 was used as a low-refractive-index material. The low-refractive-index material film was formed on the substrate by a sputtering method so as to have a thickness of 50 μm.

A green fluorescent layer was formed on the low-refractive-index material film in the same manner as in Comparative Example 1. When blue LED light with a wavelength of 450 nm was made to enter as excitation light from the back of the fluorescent substrate while the side surfaces of the fluorescent layer were covered with a light-shielding film in the same manner as in Comparative Example 1, it was confirmed that fluorescence was not output from the side surfaces of the substrate and the surroundings of the substrate did not become blurred when the fluorescent substrate was viewed from the front.

The luminance conversion efficiency of the fluorescent substrate at 25° C. concerning fluorescence output from the front when blue LED light with a wavelength of 450 nm was made to enter as excitation light from the back of the fluorescent substrate was measured in the same manner as in Comparative Example 1. The luminance of the blue LED light serving as excitation light was 1000 cd/m$^2$ whereas the luminance of green light emitted from the fluorescent body and having an emission peak wavelength of 547 nm was 816 cd/m$^2$. As a result, the luminance conversion efficiency was 80%, and the luminance was decreased compared with Comparative Example 1.

Example 1: Refer to FIG. 1

A low-refractive-index material film was formed on the same glass substrate as in Comparative Example 2. A fluorocarbon resin having a refractive index of about 1.35 to 1.4 was used as a low-refractive-index material. The low-refractive-index material film was formed on the substrate by a sputtering method so as to have a thickness of 50 μm.

A green fluorescent layer was formed on the low-refractive-index material film in the same manner as in Comparative Example 2.

An aluminum total reflection film was uniformly formed by a sputtering method on the side surfaces of the fluorescent layer prepared in Comparative Example 2 so as to have a thickness of 50 nm.

When blue LED light with a wavelength of 450 nm was made to enter as excitation light from the back of the fluorescent substrate, it was confirmed that fluorescence was not output from the side surfaces of the substrate. When the fluorescent substrate was viewed from the front, it was confirmed that the surroundings of the substrate did not become blurred at the same level as in Comparative Example 2 despite the state in which the side surfaces of the fluorescent layer were not covered with a light-shielding film.

The luminance conversion efficiency of the fluorescent substrate at 25° C. concerning fluorescence output from the front when blue LED light with a wavelength of 450 nm was made to enter as excitation light from the back of the fluorescent substrate was measured in the same manner as in Comparative Examples 1 and 2. The luminance of the blue LED light serving as excitation light was 1000 cd/m$^2$ whereas the luminance of green light emitted from the fluorescent body and having an emission peak wavelength of 547 nm was 2692 cd/m$^2$. As a result, the luminance conversion efficiency was 260%, and 2.6 times the luminance was observed compared with Comparative Example 1.

Example 2, Refer to FIG. 5

A low-refractive-index material film was formed on the same glass substrate as in Comparative Example 2. A fluorocarbon resin having a refractive index of about 1.35 to 1.4 was used as a low-refractive-index material. The low-refractive-index material film was formed on the substrate by a sputtering method so as to have a thickness of 50 μm.

A green fluorescent layer was formed on the low-refractive-index material film in the same manner as in Comparative Example 2.

An aluminum total reflection film was uniformly formed by a sputtering method on the side surfaces of the fluorescent layer prepared in Comparative Example 2 so as to have a thickness of 50 nm.

Subsequently, a dielectric multilayer film prepared by alternately forming six layers of titanium oxide ($TiO_2$: refractive index 2.30) and silicon oxide ($SiO_2$: refractive index 1.47) by an EB deposition method was formed as a wavelength-selective transmission/reflection film on the prepared fluorescent layer by a sputtering method so as to have a thickness of 100 nm.

When blue LED light with a wavelength of 450 nm was made to enter as excitation light from the back of the fluorescent substrate in the same manner as in Comparative Examples 1 and 2, it was confirmed that fluorescence was not output from the side surfaces of the substrate. When the fluorescent substrate was viewed from the front, it was confirmed that the surroundings of the substrate did not become blurred at the same level as in Example 1.

The luminance conversion efficiency of the fluorescent substrate at 25° C. concerning fluorescence output from the front when blue LED light with a wavelength of 450 nm was made to enter as excitation light from the back of the fluorescent substrate was measured in the same manner as in Comparative Examples 1 and 2. The luminance of the blue LED light serving as excitation light was 1000 cd/m$^2$ whereas the luminance of green light emitted from the fluorescent body and having an emission peak wavelength of 547 nm was 3235 cd/m$^2$. As a result, the luminance conversion efficiency was 320%, and 3.2 times the luminance was observed compared with Comparative Example 1.

Table 1 shows the luminance and luminance conversion efficiency of Comparative Examples 1 and 2 and Examples 1 and 2 of the present invention, the comparison with Comparative Example 1, and the blurriness at the surroundings of the fluorescent substrate.

TABLE 1

|  | Luminance (cd/m$^2$) | Luminance conversion efficiency (%) | Comparison with Comparative Example 1 | Blurriness at surroundings of fluorescent substrate |
|---|---|---|---|---|
| Comparative Example 1 | 1023 | 100 | — | Yes |
| Comparative Example 2 | 816 | 80 | 0.8 times | No |
| Example 1 | 2692 | 260 | 2.6 times | No (*) |
| Example 2 | 3235 | 320 | 3.2 times | No (*) |

(*) No blurriness was observed in a state in which the side surfaces of the fluorescent layer were not covered with a light-shielding film.

Example 3

Blue Organic EL Element+Fluorescent Body

A low-refractive-index material film was formed on a glass substrate having a thickness of 0.7 mm. A fluorocarbon resin having a refractive index of about 1.35 to 1.4 was used as a low-refractive-index material. The low-refractive-index material film was formed on the substrate by a sputtering method so as to have a thickness of 50 μm.

A red fluorescent layer, a green fluorescent layer, and a blue scattering layer were formed on the low-refractive-index material film to obtain a fluorescent substrate.

Trapezoid low-reflective layers composed of chromium and having a width of 20 μm and a thickness of 500 nm were formed on the substrate at a pitch of 200 μm.

The red fluorescent layer was formed as follows. First, 15 g of ethanol and 0.22 g of γ-glycidoxypropyltriethoxysilane were added to 0.16 g of Aerosil having an average particle size of 5 nm and stirred in an open system at room temperature for one hour. This mixture and 20 g of a red fluorescent body $K_5Eu_{2.5}(WO_4)_{6.25}$ were transferred into a mortar and thoroughly mixed by grinding. The resultant mixture was heated in an oven at 70° C. for two hours and further heated in an oven at 120° C. for two hours to obtain surface modified $K_5Eu_{2.5}(WO_4)_{6.25}$.

Subsequently, 30 g of polyvinyl alcohol dissolved in a mixed solution (300 g) of water/dimethyl sulfoxide=1/1 was added to 10 g of the surface modified $K_5Eu_{2.5}(WO_4)_{6.25}$ and stirred with a dispersing device to prepare a coating solution for forming red fluorescent bodies. The thus-prepared coating solution for forming red fluorescent bodies was applied by a screen printing method onto the glass substrate in a region in which the low-reflective layers were not formed.

The glass substrate was dried by heating in a vacuum oven (200° C., 10 mmHg) for four hours to form a red fluorescent layer having a thickness of 50 μm.

The green fluorescent layer was formed as follows. First, 15 g of ethanol and 0.22 g of γ-glycidoxypropyltriethoxysilane were added to 0.16 g of Aerosil having an average particle size of 5 nm and stirred in an open system at room temperature for one hour. This mixture and 20 g of a green fluorescent body $Ba_2SiO_4:Eu^{2+}$ were transferred into a mortar and thoroughly mixed by grinding. The resultant mixture was heated in an oven at 70° C. for two hours and further heated in an oven at 120° C. for two hours to obtain surface modified $Ba_2SiO_4:Eu^{2+}$.

Subsequently, 30 g of polyvinyl alcohol dissolved in a mixed solution (300 g) of water/dimethyl sulfoxide=1/1 was added to 10 g of surface modified $Ba_2SiO_4:Eu^{2+}$ and stirred with a dispersing device to prepare a coating solution for forming green fluorescent bodies. The thus-prepared coating solution for forming green fluorescent bodies was applied by a screen printing method onto the glass substrate in a region in which the low-reflective layers were not formed. The glass substrate was dried by heating in a vacuum oven (200° C., 10 mmHg) for four hours to form a green fluorescent layer having a thickness of 50 μm.

The blue scattering layer was formed as follows. Thirty grams of polyvinyl alcohol dissolved in a mixed solution (300 g) of water/dimethyl sulfoxide=1/1 was added to 20 g of silica particles (refractive index: 1.65) having a particle size of 1.5 μm and stirred with a dispersing device to prepare a coating solution for forming blue scattering layers.

The thus-prepared coating solution for forming blue scattering layers was applied by a screen printing method onto the glass substrate in a region in which the low-reflective layers were not formed. The glass substrate was dried by heating in a vacuum oven (200° C., 10 mmHg) for four hours to form a blue scattering layer.

Subsequently, an aluminum total reflection film was uniformly formed by a sputtering method on the side surfaces of the fluorescent layers so as to have a thickness of 50 nm.

Subsequently, a dielectric multilayer film prepared by alternately forming six layers of titanium oxide ($TiO_2$: refractive index 2.30) and silicon oxide ($SiO_2$: refractive index 1.47) by an EB deposition method was formed as a wavelength-selective transmission/reflection film on the side surfaces of the prepared fluorescent layers by a sputtering method so as to have a thickness of 100 nm. Thus, a fluorescent substrate was produced.

A reflective electrode composed of silver was formed on a glass substrate having a thickness of 0.7 mm by a sputtering method so as to have a thickness of 100 nm. A film composed of indium tin oxide (ITO) was formed thereon by a sputtering method so as to have a thickness of 20 nm. Thus, a reflective electrode (anode) serving as a first electrode was formed. The first electrode was patterned by a publicly known photolithography method so as to have 90 stripes each having a width of 160 μm and arranged at a pitch of 200 μm.

Subsequently, a $SiO_2$ layer having a thickness of 200 nm was stacked on the first electrode by a sputtering method and patterned by a publicly known photolithography method so as to cover only an edge portion of the first electrode. Herein, portions 10 μm from the edges of the short sides of the first electrode were covered with the $SiO_2$ layer. The resultant substrate was washed with water; then subjected to ultrasonic cleaning with pure water for 10 minutes, ultrasonic cleaning with acetone for 10 minutes, and steam cleaning with isopropyl alcohol for 5 minutes; and dried at 120° C. for one hour.

This substrate was then clamped in a substrate holder in a resistance heating evaporator and the pressure was reduced to a vacuum of $1\times10^{-4}$ Pa or less. Each organic layer was formed.

A hole injection layer having a thickness of 100 nm was formed by a resistance heating evaporation method using 1,1-bis(di-4-tolylaminophenyl)cyclohexane (TAPC) as a hole injection material.

A hole transport layer having a thickness of 40 nm was then formed by a resistance heating evaporation method using N,N'-di-1-naphthyl-N,N'-diphenyl-1,1'-biphenyl-1,1'-biphenyl-4,4'-diamine (NPD) as a hole transport material.

A blue organic light emitting layer (thickness: 30 nm) was formed on the hole transport layer. The blue organic light emitting layer was formed by co-depositing 1,4-bis(triphenylsilyl)benzene (UGH-2) (host material) and bis[(4,6-difluorophenyl)-pyridinato-N,C2']picolinate iridium (III) (FIrpic) (blue phosphorescent emitting dopant) at deposition rates of 1.5 Å/sec and 0.2 Å/sec, respectively.

A hole blocking layer (thickness: 10 nm) was then formed on the light emitting layer using 2,9-dimethyl-4,7-diphenyl-1,10-phenanthroline (BCP).

An electron transport layer (thickness: 30 nm) was formed on the hole blocking layer using tris(8-hydroxyquinoline) aluminum ($Alq_3$).

An electron injection layer (thickness: 0.5 nm) was then formed on the electron transport layer using lithium fluoride (LiF).

After that, a semitransparent electrode was formed as a second electrode. The above substrate was clamped in a metal deposition chamber. Next, a shadow mask (a mask having such openings that second electrodes each having a width of 500 μm can be formed in a striped pattern at a pitch of 600 μm so as to face the stripes of the first electrode) for forming the second electrode was aligned with the substrate. Magnesium and silver (thickness: 1 nm) were formed in a desired pattern by co-depositing magnesium and silver on the surface of the electron injection layer by a vacuum deposition method at deposition rates of 0.1 Å/sec and 0.9 Å/sec, respectively. Furthermore, silver (thickness: 19 nm) was formed thereon in a desired pattern at a deposition rate of 1 Å/sec for the purpose of enhancing the interference effect and preventing the voltage drop due to the wiring resistance in the second electrode. Thus, a second electrode was formed. In the organic EL element, a micro-cavity effect (interference effect) is produced between the reflective electrode (first electrode) and the semitransparent electrode (second electrode), which can increase the front luminance. Consequently, the emission energy from the organic EL element can be efficiently transferred to the fluorescent layer. The emission peak wavelength was adjusted to 460 nm and the full width at half maximum was adjusted to 50 nm by the micro-cavity effect.

An inorganic protective layer composed of $SiO_2$ and having a thickness of 3 μm was then formed by a plasma CVD method using a shadow mask in a sealing area located in a range extending outward from the top, bottom, left, and right edges of the display unit to 2 mm from the edges. Thus, a light source substrate including the organic EL element was produced.

Subsequently, the thus-produced organic EL element substrate and fluorescent substrate were aligned with each other using an alignment mark formed outside the display unit. Since a thermosetting resin was applied onto the fluorescent substrate in advance, both the substrates were brought into close contact with each other so as to sandwich the thermosetting resin and curing was performed by heating at 80° C. for two hours. This bonding process was conducted in a dry air environment (moisture content: −80° C.) for the purpose of preventing the degradation of organic EL due to moisture.

Finally, terminals formed in the periphery were connected to an external power supply, whereby an organic EL display apparatus was completed.

There was provided an excitation light source in which a blue-light-emitting organic EL element could be freely switched by applying a desired electric current to a desired striped electrode from the external power supply. The blue light was converted into red light and green light through the red fluorescent layer and the green fluorescent layer, respectively, and thus isotropic red light and isotropic green light were obtained. Furthermore, isotropic blue light was obtained through the blue scattering layer. Accordingly, full-color display was achieved and a good image and an image having good viewing angle characteristics were able to be formed.

Example 4

Active Drive Blue Organic El+Fluorescent Body

The fluorescent substrate was produced in the same manner as in Example 4.

An amorphous silicon semiconductor film was formed on a glass substrate having a size of 100×100 mm by a PECVD method. A polycrystalline silicon semiconductor film was then formed by performing crystallization. The polycrystalline silicon semiconductor film was then patterned into islands by a photolithography method. A gate insulating film and a gate electrode layer were then formed on the patterned polycrystalline silicon semiconductor film in that order and patterning was performed by a photolithography method.

Subsequently, the patterned polycrystalline silicon semiconductor film was doped with an impurity element such as phosphorus to form a source region and a drain region, and thus a TFT element was produced. Next, a planarizing film was formed by stacking a silicon nitride film formed by a PECVD method and an acrylic resin layer formed with a spin coater in that order.

After the silicon nitride film was formed, the silicon nitride film and the gate insulating film were etched at one time to form a contact hole that reaches the source or drain region, and then a source wiring line was formed. Subsequently, the acrylic resin layer was formed and a contact hole that reaches the drain region was formed at the same position as that of the contact hole in the drain region, the contact hole being made in the gate insulating film and the silicon nitride film, whereby an active-matrix substrate was completed. The function of the planarizing film was realized by the acrylic resin layer. A capacitor for controlling the gate potential of a TFT to be a constant potential was formed by disposing an insulating film such as an interlayer insulating film between the drain of a switching TFT and the source of a driving TFT.

A contact hole that penetrates through the planarizing layer was disposed on the active-matrix substrate in order to electrically connect the driving TFT, a first electrode of a red-light-emitting organic EL element, a first electrode of a green-light-emitting organic EL element, and a first electrode of a blue-light-emitting organic EL element.

A first electrode (anode) of each pixel was then formed in the contact hole by a sputtering method, the contact hole penetrating through the planarizing layer and being connected to the TFT for driving each emission pixel. The first electrode is electrically connected to the TFT for driving each emission pixel. The first electrode was formed by stacking an Al (aluminum) layer having a thickness of 150 nm and an IZO (indium oxide-zinc oxide) layer having a thickness of 20 nm.

The first electrode was then patterned into a shape corresponding to each pixel by a publicly known photolithography method. The area of the first electrode was set to be 300 μm×160 μm. The area of the display unit formed on a substrate having a size of 100 mm×100 mm was set to be 80 mm×80 mm. There was a sealing area having a width of 2 mm from the top, bottom, left, and right edges of the display unit. On the short side, terminal leading portions each having a width of 2 mm were disposed outside the sealing area. On the long side, a terminal leading portion having a width of 2 mm was disposed on the side where bending was to be performed.

Subsequently, $SiO_2$ of the first electrode was stacked by a sputtering method so as to have a thickness of 200 nm, and patterned by a publicly known photolithography method so as to cover an edge portion of the first electrode. Herein, a portion 10 μm from the edges of the four sides of the first electrode was covered with $SiO_2$ to provide an edge cover.

The active substrate was then washed, for example, by performing ultrasonic cleaning with acetone and IPA for 10 minutes and then performing UV-ozone cleaning for 30 minutes.

This substrate was then clamped in a substrate holder in an in-line type resistance heating evaporator and the pressure was reduced to a vacuum of $1 \times 10^{-4}$ Pa or less. Each organic layer was formed.

A hole injection layer having a thickness of 100 nm was formed by a resistance heating evaporation method using 1,1-bis(di-4-tolylaminophenyl)cyclohexane (TAPC) as a hole injection material.

A hole transport layer having a thickness of 40 nm was then formed by a resistance heating evaporation method using N,N'-di-1-naphthyl-N,N'-diphenyl-1,1'-biphenyl-1,1'-biphenyl-4,4'-diamine (NPD) as a hole transport material.

A blue organic light emitting layer (thickness: 30 nm) was then formed on the hole transport layer. The blue organic light emitting layer was formed by co-depositing 1,4-bis(triphenylsilyl)benzene (UGH-2) (host material) and bis[(4,6-difluorophenyl)-pyridinato-N,C2']picolinate iridium (III) (FIrpic) (blue phosphorescent emitting dopant) at deposition rates of 1.5 Å/sec and 0.2 Å/sec, respectively.

A hole blocking layer (thickness: 10 nm) was then formed on the light emitting layer using 2,9-dimethyl-4,7-diphenyl-1,10-phenanthroline (BCP).

An electron transport layer (thickness: 30 nm) was formed on the hole blocking layer using tris(8-hydroxyquinoline) aluminum ($Alq_3$).

An electron injection layer (thickness: 0.5 nm) was then formed on the electron transport layer using lithium fluoride (LiF).

After that, a semitransparent electrode was formed as a second electrode. The above substrate was clamped in a metal deposition chamber. Next, a shadow mask (a mask having such openings that second electrodes each having a width of 2 mm can be formed in a striped pattern so as to face the stripes of the first electrode) for forming the second electrode was aligned with the substrate. Magnesium and silver (thickness: 1 nm) were formed in a desired pattern by co-depositing magnesium and silver on the surface of the electron injection layer by a vacuum deposition method at deposition rates of 0.1 Å/sec and 0.9 Å/sec, respectively.

Furthermore, silver (thickness: 19 nm) was formed thereon in a desired pattern at a deposition rate of 1 Å/sec for the purpose of enhancing the interference effect and preventing the voltage drop due to the wiring resistance in the second electrode. Thus, a second electrode was formed. In the organic EL element, a micro-cavity effect (interference effect) is produced between the reflective electrode (first electrode) and the semitransparent electrode (second electrode), which can increase the front luminance. Consequently, the emission energy from the organic EL element can be efficiently transferred to the fluorescent layer and an orientation enhancing layer. The emission peak wavelength was adjusted to 460 nm and the full width at half maximum was adjusted to 50 nm by the micro-cavity effect.

An inorganic protective layer composed of $SiO_2$ and having a thickness of 3 μm was then formed by a plasma CVD method using a shadow mask in a sealing area located in a range extending outward from the top, bottom, left, and right edges of the display unit to 2 mm from the edges. Thus, an active drive organic EL element substrate was produced.

Subsequently, the thus-produced active drive organic EL element substrate and fluorescent substrate were aligned with each other using an alignment mark formed outside the display unit. Since a thermosetting resin was applied onto the fluorescent substrate in advance, both the substrates were brought into close contact with each other so as to sandwich the thermosetting resin and curing was performed by heating at 90° C. for two hours. This bonding process was conducted in a dry air environment (moisture content: −80° C.) for the purpose of preventing the degradation of organic EL due to moisture.

Subsequently, a polarizing plate was bonded to the substrate on the light-output side to complete an active drive organic EL element.

Finally, a terminal formed on the short side was connected to a power supply circuit through a source driver and a terminal formed on the long side was connected to an external power supply through a gate driver to complete an active drive organic EL display including a display unit having a size of 80 mm×80 mm.

There was provided an excitation light source in which a blue-light-emitting organic EL element could be freely switched by applying a desired electric current to each pixel from the external power supply. The blue light was able to be converted into red light and green light through the red fluorescent layer and the green fluorescent layer, respectively, and thus isotropic red light and isotropic green light were obtained. Furthermore, isotropic blue light was obtained through the blue scattering layer. Accordingly, full-color display was achieved and a good image and an image having good viewing angle characteristics were able to be formed.

Example 5

Blue LED+Fluorescent Body

The fluorescent substrate was produced in the same manner as in Example 4.

A buffer layer composed of GaN was grown on the C-plane of a sapphire substrate set in a reaction vessel using TMG (trimethylgallium) and $NH_3$ at 550° C. so as to have a thickness of 60 nm. The temperature was then increased to 1050° C., and an n-type contact layer composed of Si-doped n-type GaN was grown using a $SiH_4$ gas in addition to TMG and $NH_3$ so as to have a thickness of 5 μm. A second cladding layer composed of Si-doped n-type $Al_{0.3}Ga_{0.7}N$ layer was then grown using TMA (trimethylaluminum) in addition to the raw material gases at 1050° C. so as to have a thickness of 0.2 μm.

The temperature was then decreased to 850° C., and a first n-type cladding layer composed of Si-doped n-type $In_{0.01}Ga_{0.99}N$ was grown using TMG, TMI (trimethylindium), $NH_3$, and $SiH_4$ so as to have a thickness of 60 nm.

An active layer composed of non-doped $In_{0.05}Ga_{0.95}N$ was then grown using TMG, TMI, and $NH_3$ at 850° C. so as to have a thickness of 5 nm. Furthermore, a first p-type cladding layer composed of Mg-doped p-type $In_{0.01}Ga_{0.99}N$ was grown using CPMg (cyclopentadienylmagnesium) in addition to TMG, TMI, and $NH_3$ at 850° C. so as to have a thickness of 60 nm.

The temperature was then increased to 1100° C., and a second p-type cladding layer composed of Mg-doped p-type $Al_{0.3}Ga_{0.7}N$ was grown using TMG, TMA, $NH_3$, and CPMg so as to have a thickness of 150 nm.

A p-type contact layer composed of Mg-doped p-type GaN was then grown using TMG, $NH_3$, and CPMg at 1100° C. so as to have a thickness of 600 nm. After the completion of the above processes, the temperature was decreased to room temperature and a wafer was taken out of the reaction vessel. The wafer was annealed at 720° C. to reduce the resistance of the p-type layer. A mask having a particular shape was then formed on the surface of the p-type contact layer, which was the uppermost layer, and etching was performed until the surface of the n-type contact layer was exposed.

After the etching, a cathode composed of titanium (Ti) and aluminum (Al) was formed on the surface of the n-type contact layer and an anode composed of nickel (Ni) and gold (Au) was formed on the surface of the p-type contact layer. After the formation of the electrodes, the wafer was cut into chips each having a size of 350 µm square. Each of the LED chips was fixed, using a UV-curable resin, on a substrate on which a wiring line for making a connection to a separately prepared external circuit was formed, to electrically connect the LED chip to the wiring line on the substrate. Thus, a light source substrate including a blue LED was produced.

Subsequently, the thus-produced light source substrate and fluorescent substrate were aligned with each other using an alignment mark formed outside the display unit. Since a thermosetting resin was applied onto the fluorescent substrate in advance, both the substrates were brought into close contact with each other so as to sandwich the thermosetting resin and curing was performed by heating at 80° C. for two hours. This bonding process was conducted in a dry air environment (moisture content: −80° C.) for the purpose of preventing the degradation of the organic EL element due to moisture.

Finally, terminals formed in the periphery were connected to an external power supply, whereby an LED display apparatus was completed.

There was provided an excitation light source in which a blue-light-emitting organic EL element could be freely switched by applying a desired electric current to a desired striped electrode from the external power supply. The blue light was able to be converted into red light and green light through the red fluorescent layer and the green fluorescent layer, respectively, and thus isotropic red light and isotropic green light were obtained. Furthermore, isotropic blue light was obtained through the blue scattering layer. Accordingly, full-color display was achieved and a good image and an image having good viewing angle characteristics were able to be formed.

Example 6

Blue Organic EL+Liquid Crystal+Fluorescent Body

A low-refractive-index material film was formed on a glass substrate having a thickness of 0.7 mm. A fluorocarbon resin having a refractive index of about 1.35 to 1.4 was used as a low-refractive-index material. The low-refractive-index material film was formed on the substrate by a sputtering method so as to have a thickness of 50 µm.

Subsequently, a red fluorescent layer, a green fluorescent layer, and a blue scattering layer were formed on the low-refractive-index material film to produce a fluorescent substrate.

Trapezoid low-reflective layers composed of chromium and having a width of 20 µm and a thickness of 500 nm were formed on the substrate at a pitch of 200 µm. The surfaces of the low-reflective layers were subjected to a water-repellent treatment by a CF4 plasma treatment.

The red fluorescent layer was formed as follows. First, [2-[2-[4-(dimethylamino)phenyl]ethenyl]-6-methyl-4H-pyran-4-ylidene]propanedinitrile (DCM) (0.02 mol/kg (solid content ratio)) was mixed in an epoxy thermosetting resin and stirred with a dispersing device to prepare a coating solution for forming red fluorescent bodies. The coating solution for forming red fluorescent bodies was applied by an ink-jet method onto the glass substrate in a region in which the low-reflective layers were not formed. Curing was performed in a vacuum oven (150° C.) for one hour to form a red fluorescent layer having a thickness of 2 µm. The cross-sectional shape of the red fluorescent layer was a semicylindrical shape because of the effect produced by the water-repellent treatment of the low-reflective layers.

The green fluorescent layer was formed as follows. First, 2,3,6,7-tetrahydro-11-oxo-1H,5H,11H-[1]benzopyrano[6,7,8-ij]quinolizine-10-carboxylic acid (Coumarin 519) (0.02 mol/kg (solid content ratio)) was mixed in an epoxy thermosetting resin and stirred with a dispersing device to prepare a coating solution for forming green fluorescent bodies. The coating solution for forming green fluorescent bodies was applied by an ink-jet method onto the glass substrate in a region in which the low-reflective layers were not formed. Curing was performed in a vacuum oven (150° C.) for one hour to form a green fluorescent layer having a thickness of 2 µm. The cross-sectional shape of the green fluorescent layer was a semicylindrical shape because of the effect produced by the water-repellent treatment of the low-reflective layers.

The blue fluorescent layer was formed as follows. First, 7-hydroxy-4-methylcoumarin (Coumarin 4) (0.02 mol/kg (solid content ratio)) was mixed in an epoxy thermosetting resin and stirred with a dispersing device to prepare a coating solution for forming blue fluorescent bodies. The coating solution for forming blue fluorescent bodies was applied by an ink-jet method onto the glass substrate in a region in which the low-reflective layers were not formed. Curing was performed in a vacuum oven (150° C.) for one hour to form a blue fluorescent layer having a thickness of 2 µm. The cross-sectional shape of the blue fluorescent layer was a semicylindrical shape because of the effect produced by the water-repellent treatment of the low-reflective layers.

An aluminum total reflection film was uniformly formed by a sputtering method on the side surfaces of the fluorescent layer so as to have a thickness of 50 nm.

Subsequently, a dielectric multilayer film prepared by alternately forming six layers of titanium oxide ($TiO_2$: refractive index 2.30) and silicon oxide ($SiO_2$: refractive index 1.47) by an EB deposition method was formed as a wavelength-selective transmission/reflection film on the side surfaces of the prepared fluorescent layer by a sputtering method so as to have a thickness of 100 nm.

Subsequently, a planarizing film was formed on the dielectric multilayer film using an acrylic resin by a spin coating method. A polarizing film, a transparent electrode, and a light distribution film were formed on the planarizing film by a publicly known method to produce a fluorescent substrate.

Subsequently, a switching element constituted by a TFT was formed on the glass substrate by a publicly known method. An ITO transparent electrode having a thickness of 100 nm was then formed so as to be electrically connected to the TFT through a contact hole. The transparent electrode was then patterned by a typical photolithography method so as to have the same pitch as that of pixels of the prepared organic EL unit. An alignment film was then formed by a printing method.

Subsequently, the substrate including the TFT formed thereon and the fluorescent substrate were bonded to each other with a spacer having a thickness of 10 µm therebetween.

A TN-mode liquid crystal material was inserted between the substrate including the TFT formed thereon and the fluorescent substrate and thus a liquid crystal/fluorescent unit was completed.

A reflective electrode composed of silver was formed on a glass substrate having a thickness of 0.7 mm by a sputtering method so as to have a thickness of 100 nm. A film composed of indium tin oxide (ITO) was formed thereon by a sputtering method so as to have a thickness of 20 nm. Thus, a reflective electrode (anode) serving as a first electrode was formed. The first electrode was patterned by a publicly known photolithography method so as to have a desired size.

Subsequently, a $SiO_2$ layer having a thickness of 200 nm was stacked on the first electrode by a sputtering method and patterned by a publicly known photolithography method so as to cover only an edge portion of the first electrode. Herein, portions 10 μm from the edges of the short sides of the first electrode were covered with $SiO_2$. The resultant substrate was washed with water; then subjected to ultrasonic cleaning with pure water for 10 minutes, ultrasonic cleaning with acetone for 10 minutes, and steam cleaning with isopropyl alcohol for 5 minutes; and dried at 120° C. for one hour.

This substrate was then clamped in a substrate holder in a resistance heating evaporator and the pressure was reduced to a vacuum of $1 \times 10^{-4}$ Pa or less. Each organic layer was formed.

A hole injection layer having a thickness of 100 nm was formed by a resistance heating evaporation method using 1,1-bis(di-4-tolylaminophenyl)cyclohexane (TAPC) as a hole injection material.

A hole transport layer having a thickness of 10 nm was then formed by a resistance heating evaporation method using carbazole biphenyl (CBP) as a hole transport material.

A near-ultraviolet organic light emitting layer (thickness: 30 nm) was then formed on the hole transport layer. The near-ultraviolet organic light emitting layer was formed by depositing 3,5-bis(4-t-butylphenyl)-4-phenyl-[1,2,4]triazole (TAZ) (near-ultraviolet phosphorescent emitting material) at a deposition rate of 1.5 Å/sec.

An electron transport layer (thickness: 20 nm) was then formed on the light emitting layer using 2,9-dimethyl-4,7-diphenyl-1,10-phenanthroline (BCP).

An electron injection layer (thickness: 0.5 nm) was then formed on the electron transport layer using lithium fluoride (LiF).

After that, a semitransparent electrode was formed as a second electrode. The above substrate was clamped in a metal deposition chamber. Next, a shadow mask (a mask having such openings that second electrodes each having a width of 500 μm can be formed in a striped pattern at a pitch of 600 μm so as to face the stripes of the first electrode) for forming the second electrode was aligned with the substrate. Magnesium and silver (thickness: 1 nm) were formed in a desired pattern by co-depositing magnesium and silver on the surface of the electron injection layer by a vacuum deposition method at deposition rates of 0.1 Å/sec and 0.9 Å/sec, respectively. Furthermore, silver (thickness: 19 nm) was formed thereon in a desired pattern at a deposition rate of 1 Å/sec for the purpose of enhancing the interference effect and preventing the voltage drop due to the wiring resistance in the second electrode.

Thus, a second electrode was formed. In the organic EL element, a micro-cavity effect (interference effect) is produced between the reflective electrode (first electrode) and the semitransparent electrode (second electrode), which can increase the front luminance. Consequently, the emission energy from the organic EL element can be efficiently transferred to the fluorescent layer. The emission peak wavelength was adjusted to 370 nm and the full width at half maximum was adjusted to 30 nm by the micro-cavity effect.

An inorganic protective layer composed of $SiO_2$ and having a thickness of 3 μm was then formed by a plasma CVD method using a shadow mask in a sealing area located in a range extending outward from the top, bottom, left, and right edges of the display unit to 2 mm from the edges. Thus, a light source substrate including the organic EL element was produced.

Finally, the organic EL unit and the liquid crystal/fluorescent unit were aligned using a thermosetting resin disposed therebetween and curing was performed to complete a display apparatus.

By applying an electric current from an external power supply to cause emission of a particular organic EL unit and by applying a particular voltage to an electrode for driving liquid crystal, a desired good image and an image having good viewing angle characteristics were able to be formed.

INDUSTRIAL APPLICABILITY

The embodiments of the present invention can be applied to a fluorescent substrate, and a display apparatus and an illuminating apparatus that use the fluorescent substrate.

REFERENCE SIGNS LIST

10 light emitting device
11 first substrate
12 second substrate
13 excitation light source element
14 sealing layer
16 fluorescent layer
17 light-absorbing layer
18 optical reflection body

The invention claimed is:
1. A light emitting device comprising:
an excitation light source element that emits excitation light;
a substrate that faces the excitation light source element;
a fluorescent layer located on the substrate, the fluorescent layer being excited by the excitation light to emit fluorescence;
an optical reflection body disposed on a side surface of the fluorescent layer, the side surface extending in a direction parallel to a stacking direction of the substrate and the fluorescent layer;
a low-refractive-index material layer disposed between the fluorescent layer and the substrate, the low-refractive-index material layer having a refractive index lower than that of the substrate; and
a wavelength-selective layer that transmits at least excitation light in a peak wavelength region of a wavelength range of the excitation light and reflects at least fluorescence in a peak wavelength region of a wavelength range of the fluorescence emitted from the fluorescent layer,
wherein the fluorescent layer has an incidence surface from which the excitation light enters, the incidence surface facing the excitation light source element, and
the wavelength-selective layer is disposed on the incidence surface.
2. The light emitting device according to claim 1, wherein the fluorescent layer is separated into a plurality of regions, and the low-refractive-index material layer is disposed between the substrate and each of the separated regions of the fluorescent layer.

3. The light emitting device according to claim 2, wherein a light-absorbing layer is disposed between adjacent regions among the separated regions of the fluorescent layer.

4. The light emitting device according to claim 3, wherein the light-absorbing layer is disposed between the low-refractive-index material layer and the substrate.

5. The light emitting device according to claim 3, wherein a surface of the light-absorbing layer, the surface facing the fluorescent layer, is covered with the low-refractive-index material layer.

6. The light emitting device according to claim 1, wherein the low-refractive-index material layer has such a refractive index that a critical angle of incident light that enters the low-refractive-index material layer from the fluorescent layer is smaller than a critical angle of outgoing light output from the second substrate toward an outside.

7. The light emitting device according to claim 1, wherein the substrate is curved so that at least edges of the substrate are located closer to the excitation light source element.

8. A display apparatus comprising the light emitting device according to claim 1.

9. The display apparatus according to claim 8, wherein the excitation light source element emits excitation light in an ultraviolet wavelength range, and
the fluorescent layer includes at least a red fluorescent layer constituting a red pixel that emits red light by using the excitation light, a green fluorescent layer constituting a green pixel that emits green light by using the excitation light, and a blue fluorescent layer constituting a blue pixel that emits blue light by using the excitation light.

10. The display apparatus according to claim 8, wherein the excitation light source element emits blue excitation light,
the fluorescent layer includes at least a red fluorescent layer constituting a red pixel that emits red light by using the excitation light and a green fluorescent layer constituting a green pixel that emits green light by using the excitation light, and
the display apparatus includes a scattering layer constituting a blue pixel that scatters the excitation light.

11. The display apparatus according to claim 8, further comprising an active-matrix drive element that drives the excitation light source element.

12. The display apparatus according to claim 11, wherein the fluorescence is output from the substrate toward an outside.

13. The display apparatus according to claim 8, wherein the excitation light source element is constituted by a light emitting diode, an organic electroluminescence element, or an inorganic electroluminescence element.

14. The display apparatus according to claim 8, further comprising:
a liquid crystal element that is disposed between the excitation light source element and the substrate and can control a transmittance of the excitation light,
wherein the excitation light source element serves as a planar light source.

15. An illuminating apparatus comprising the light emitting device according to claim 1.

16. The light emitting device according to claim 1, wherein the low-refractive-index material layer has a refractive index equal to or lower than 1.5.

17. The light emitting device according to claim 16, wherein the low-refractive-index material layer has a refractive index of 1.35 to 1.4.

18. The light emitting device according to claim 16, wherein the low-refractive-index material layer comprises a fluorocarbon resin.

19. A light emitting device comprising:
an excitation light source element that emits excitation light;
a substrate that faces the excitation light source element;
a fluorescent layer located on the substrate, the fluorescent layer being excited by the excitation light to emit fluorescence;
an optical reflection body disposed on a side surface of the fluorescent layer, the side surface extending in a direction parallel to a stacking direction of the substrate and the fluorescent layer; and
a low-refractive-index material layer disposed between the fluorescent layer and the substrate, the low-refractive-index material layer having a refractive index lower than that of the substrate,
wherein the fluorescent layer is separated into a plurality of regions, and the low-refractive-index material layer is disposed between the substrate and each of the separated regions of the fluorescent layer,
a light-absorbing layer is disposed between adjacent regions among the separated regions of the fluorescent layer, and
wherein the light-absorbing layer is disposed between the low-refractive-index material layer and the substrate.

20. A light emitting device comprising:
an excitation light source element that emits excitation light;
a substrate that faces the excitation light source element;
a fluorescent layer located on the substrate, the fluorescent layer being excited by the excitation light to emit fluorescence;
an optical reflection body disposed on a side surface of the fluorescent layer, the side surface extending in a direction parallel to a stacking direction of the substrate and the fluorescent layer; and
a low-refractive-index material layer disposed between the fluorescent layer and the substrate, the low-refractive-index material layer having a refractive index lower than that of the substrate,
wherein the fluorescent layer is separated into a plurality of regions, and the low-refractive-index material layer is disposed between the substrate and each of the separated regions of the fluorescent layer,
a light-absorbing layer is disposed between adjacent regions among the separated regions of the fluorescent layer, and
wherein a surface of the light-absorbing layer, the surface facing the fluorescent layer, is covered with the low-refractive-index material layer.

* * * * *